(12) United States Patent
Roberts et al.

(10) Patent No.: US 6,570,385 B1
(45) Date of Patent: May 27, 2003

(54) HANDHELD TESTER FOR STARTING/CHARGING SYSTEMS

(75) Inventors: Robert A. Roberts, South Euclid, OH (US); Matthew H. Koran, Strongsville, OH (US); Hamid Namaky, South Russell, OH (US)

(73) Assignee: Actron Manufacturing Co., Cleveland, OH (US)

( * ) Notice: Subject to any disclaimer, the term of this patent is extended or adjusted under 35 U.S.C. 154(b) by 0 days.

(21) Appl. No.: 09/813,104

(22) Filed: Mar. 19, 2001

(51) Int. Cl.[7] ............................................... F02P 17/00
(52) U.S. Cl. ........................ 324/378; 324/380; 320/104
(58) Field of Search ................................ 324/378, 380, 324/381, 384, 391, 397, 399, 400, 402, 425–437, 500, 502, 503, 508, 511; 123/179.1; 320/104; 701/29; 74/6; 73/118.1

(56) References Cited

U.S. PATENT DOCUMENTS

| | | | |
|---|---|---|---|
| 4,178,546 A | 12/1979 | Hulls et al. | |
| 4,926,330 A | 5/1990 | Abe et al. | |
| 4,967,143 A | * 10/1990 | Raviglione et al. | ......... 324/378 |
| 5,181,858 A | 1/1993 | Matz et al. | |
| 5,281,919 A | 1/1994 | Palanisamy | |
| 5,649,001 A | 7/1997 | Thomas et al. | |
| 6,172,505 B1 | 1/2001 | Bertness | |
| 6,351,102 B1 | * 2/2002 | Troy | ......................... 320/137 |

FOREIGN PATENT DOCUMENTS

JP 09189326 7/1997

OTHER PUBLICATIONS

Annex to Form PCT/ISA/206 (PCT case corresponding to this case; only claims 1–23 were examined), Communication Relating to the Results of the Partial International Search dated Aug. 16, 2002.

* cited by examiner

Primary Examiner—N. Le
Assistant Examiner—Amy He
(74) Attorney, Agent, or Firm—Calfee, Halter & Griswold LLP

(57) ABSTRACT

An improved hand held starting/charging system tester. According to one aspect of the present invention, the portable handheld tester includes a connector to which various test cables can be removably connected to the tester. Detection circuitry within the tester determines which of several types of test cable is connected to the tester before testing. According to another aspect of the present invention, the portable handheld tester includes an improved user interface that permits a user to review test data from previously performed tests and further permits a user to either skip a previously performed test (thereby retaining the previously collected data for that test) or re-do the test (thereby collecting new data for that test). According to yet another aspect of the present invention, the portable handheld tester that performs a more complete set of tests of the starting/charging system.

44 Claims, 25 Drawing Sheets

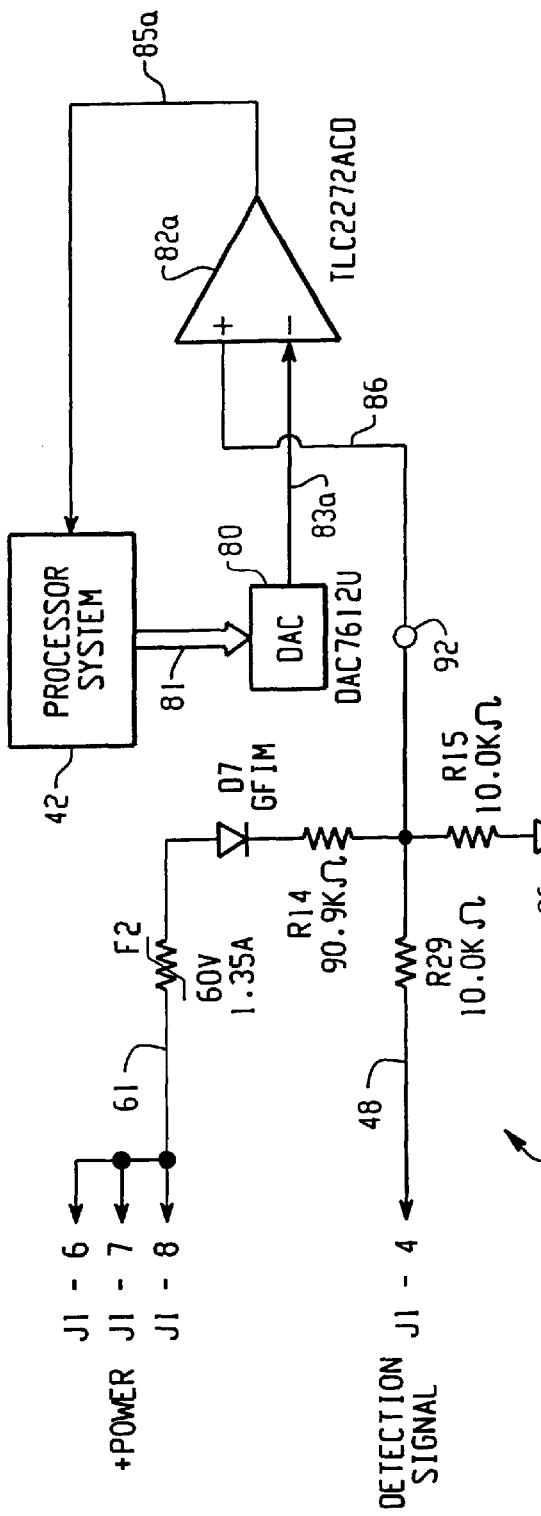

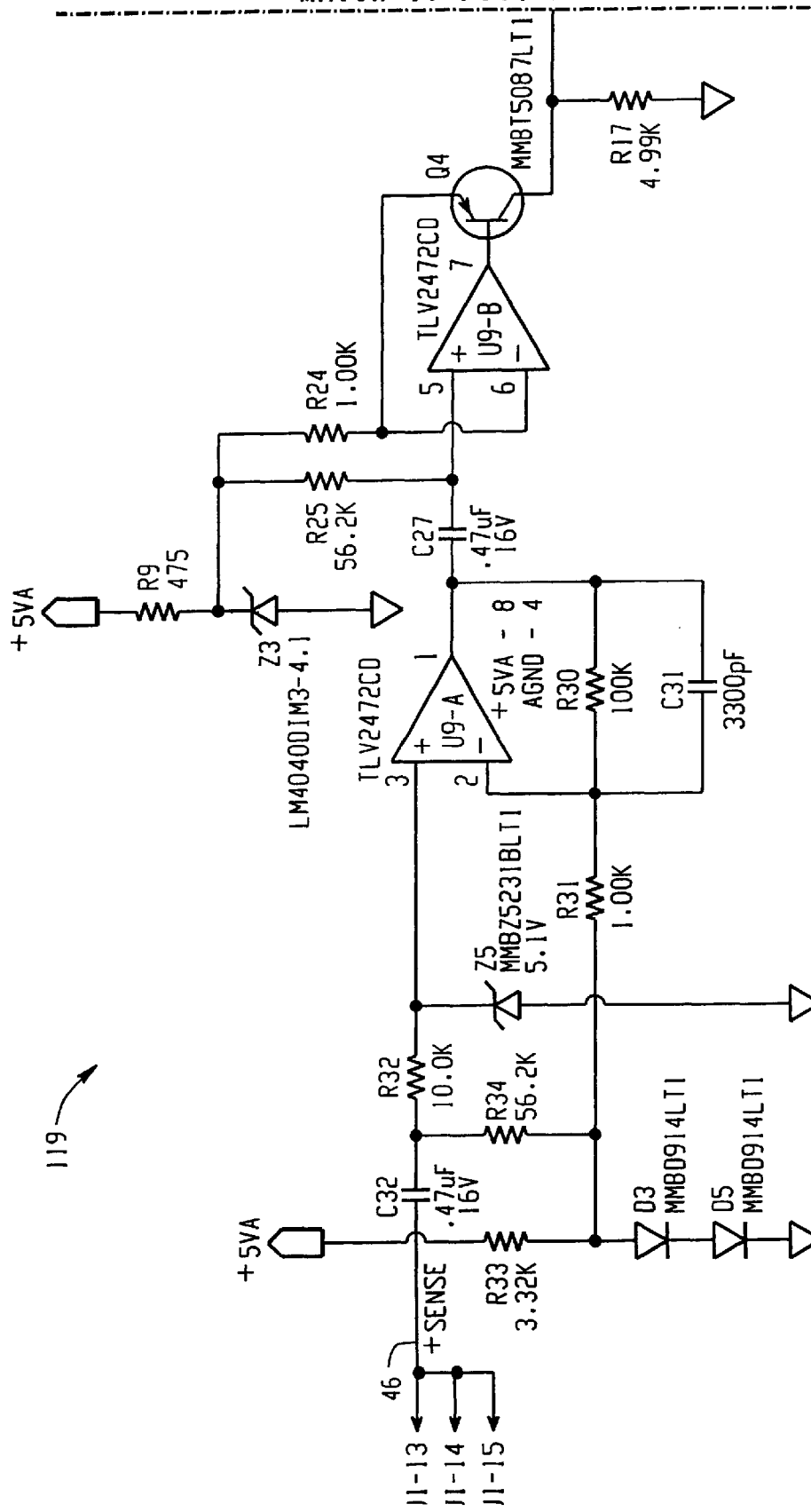
Fig. 4D1

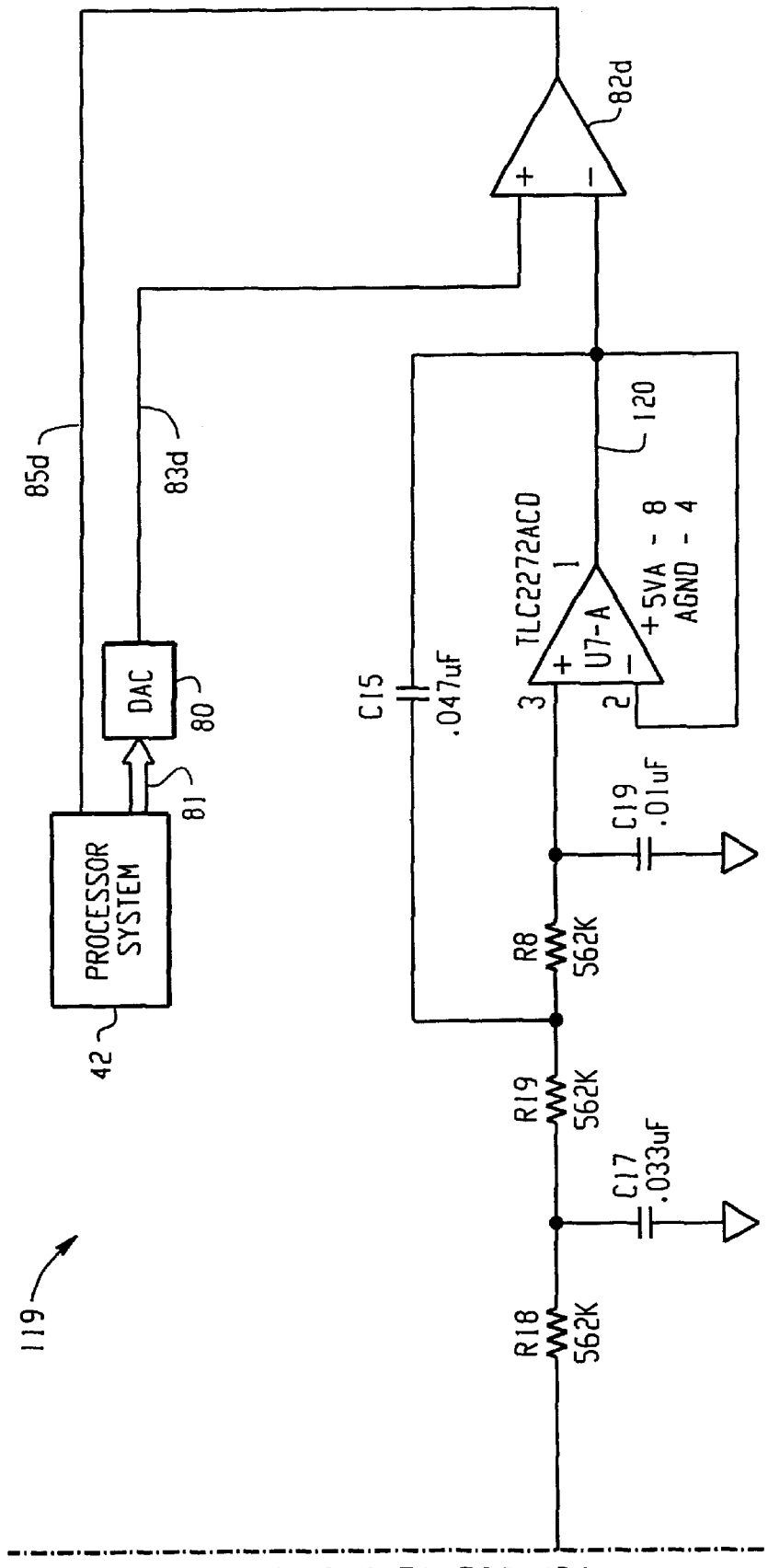
Fig. 4D2

MATCH TO FIG.11B

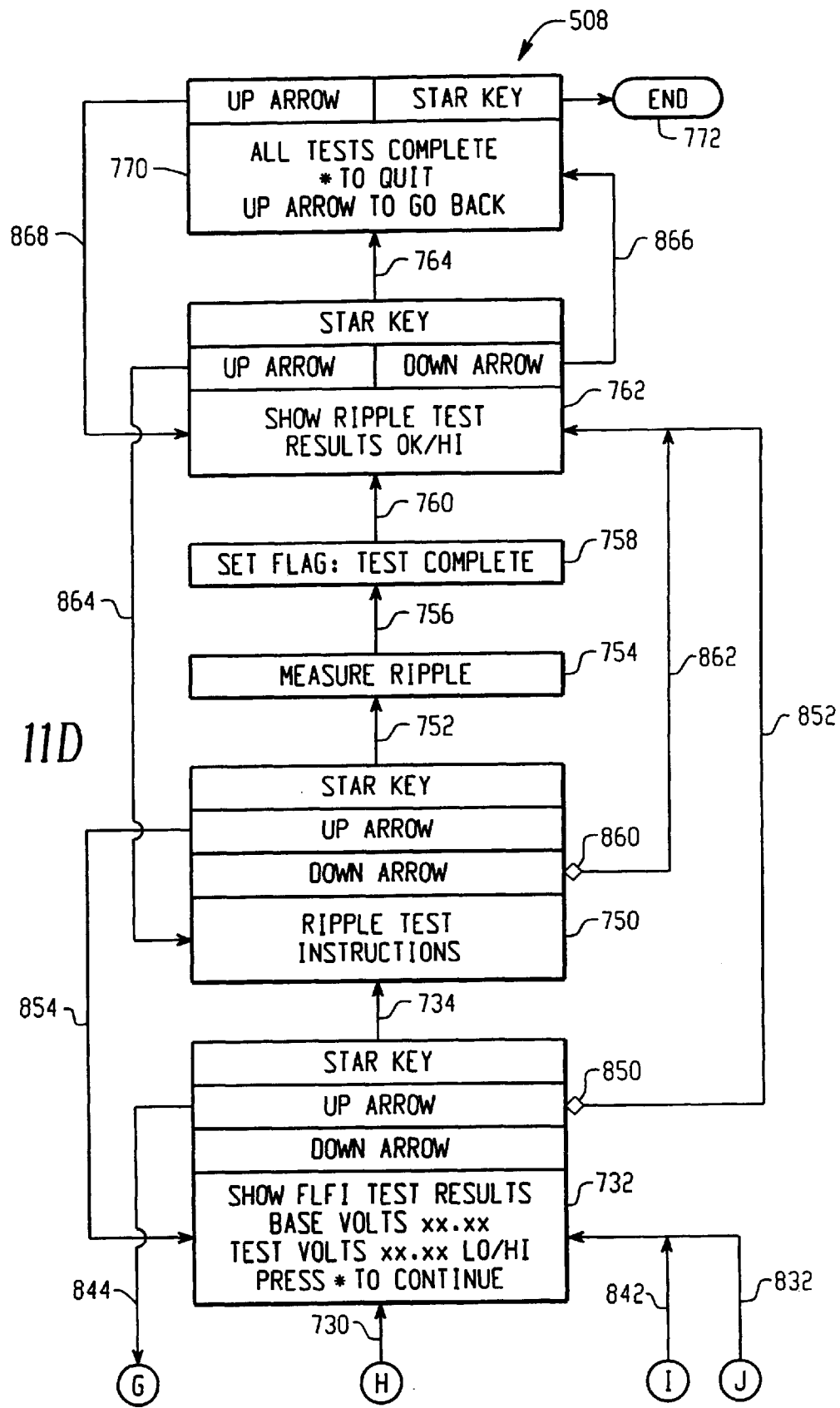

HANDHELD TESTER FOR STARTING/CHARGING SYSTEMS

FIELD OF THE INVENTION

The present invention relates generally to the field of electronic testing devices, and more specifically to a handheld device used to test the starting/charging system of an internal combustion engine in a vehicle.

BACKGROUND OF THE INVENTION

Internal combustion engines typically include a starting/charging system that typically includes a starter motor, a starter solenoid and/or relay, an alternator having a regulator (or other charger), a battery, and associated wiring and connections. It is desirable to perform diagnostic tests on various elements of starting/charging systems to determine whether they are functioning acceptably. It is typical during many such tests, e.g., starter tests, cranking tests, various regulator tests, etc., to adjust the operation of the vehicle while sitting in the driver's seat e.g., starting the engine, turning lights and other loads on and off, revving the engine to a specific number of revolutions per minute, etc. Thus, it is desirable, if not necessary, to have one person sitting in the driver's seat during many starter/charger tests to perform the tests. For other tests, e.g., battery tests, the user need not necessarily be in the driver's seat.

Testers used to test the starting/charging system of an internal combustion engine are known. For example, the KAL EQUIP 2882 Digital Analyzer and KAL EQUIP 2888 Amp Probe could be used together to perform a cranking system test, a charging system test, an alternator condition test, and an alternator output test. The KAL EQUIP 2882 Digital Analyzer is a handheld tester. Other known testers capable of testing a starting/charging system include the BEAR B.E.S.T. tester and the SUN VAT 40 tester, both of which allowed a user to test the starter, alternator, etc. Other testers capable of testing a starting/charging system exist. The aforementioned BEAR B.E.S.T. and the SUN VAT 40 testers are not handheld testers; they are typically stored and used on a cart that can be rolled around by a user.

Additionally, some other handheld testers capable of testing a starting/charging system are known. These devices typically have limited user input capability (e.g., a few buttons) and limited display capability (e.g., a two-line, 16 character display) commensurate with their relatively low cost with respect to larger units. The known handheld starting/charging system testers have several drawbacks. For example, the user interface on such devices is cumbersome. Additionally, some handheld starting/charging system testers have been sold with either a shorter (e.g., three feet) cable or a longer (e.g., fifteen feet) cable. With the shorter cable, two people would typically perform the tests of the starting/charging system, with one person under the hood with the tester and one person sitting in the driver's seat to adjust the operation of the vehicle. The longer cable would permit a single user to sit in the driver's seat to perform the tests and adjust the operation of the vehicle, but the user would need to wind up the fifteen feet of cable for storage. Lugging around the wound coils of the long cable becomes especially inconvenient when the user wants to use the tester for a quick battery check, because the wound coils of cable can be larger than the test unit itself. Additionally, the user interface in such units is typically very cumbersome.

There is a need, therefore, for an improved handheld tester capable of testing a starting/charging system of an internal combustion engine.

SUMMARY OF THE INVENTION

The present invention is directed toward an improved hand held starting/charging system tester. According to one aspect of the present invention, the portable handheld tester comprises a connector to which various cables can be removably connected to the tester. According to another aspect of the present invention, the portable handheld tester comprises an improved user interface that permits a user to review test data from previously performed tests and further permits a user to either skip a previously performed test (thereby retaining the previously collected data for that test) or re-do the test (thereby collecting new data for that test). According to yet another aspect of the present invention, the portable handheld tester performs a more complete set of tests of the starting/charging system. For example, the handheld portable tester preferably performs a starter test, three charging tests, and a diode ripple test. According to still another aspect of the present invention, the portable handheld tester performs an improved starter test. More specifically to an implementation of the starter test, the portable handheld tester performs a starter test in which the associated ignition has not been disabled, where a hardware trigger is used to detect a cranking state and then samples of cranking voltage are taken until either a predetermined number of samples have been collected or the tester determines that the engine has started.

It is therefore an advantage of the present invention to provide a portable handheld tester for a starting/charging system of an internal combustion engine having a connector to which a test cable can be removably connected to the tester.

It is also an advantage of the present invention to provide a portable handheld tester for a starting/charging system of an internal combustion engine that permits different test cables (e.g., the cables of FIGS. 5A, 7A, and 8) to be used with a single tester, thereby allowing a wider range of functions to be performed with the tester.

It is another advantage of the present invention to provide a portable handheld tester for a starting/charging system of an internal combustion engine that permits an optional extender cable (e.g., the extender cable of cable of FIGS. 6A and 6B) to be used, thereby allowing the tester to be used by one person sitting in a driver's seat for some tests, but allowing a shorter cable to be used for other tests.

It is a further advantage of this invention to provide a portable handheld tester for a starting/charging system of an internal combustion engine that allows the tester to be stored separately from the cable.

It is yet another advantage of the present invention to provide a portable handheld tester for a starting/charging system of an internal combustion engine that comprises an improved user interface.

It is still another advantage of the present invention to provide a portable handheld tester for a starting/charging system of an internal combustion engine that comprises an improved user interface in which a user can review test data from previously performed tests and in which the user can, for each previously performed test, either skip that previously performed test or re-do the test.

It is another advantage of the present invention to provide a portable handheld tester for a starting/charging system of an internal combustion engine that comprises an improved user interface in which a user can review test data from previously performed tests and in which the user can, for each previously performed test, either retain the previously collected data for that test or collect new data for that test.

It is yet another advantage of the present invention to provide a portable handheld tester for a starting/charging system of an internal combustion engine that performs a more complete set of tests of the starting/charging system, preferably a starter test, three charging tests, and a diode ripple test.

It is still another advantage of the present invention to provide a portable handheld tester for a starting/charging system of an internal combustion engine that performs an improved starter test, preferably in which a hardware trigger is used to detect a cranking state and then samples of cranking voltage are taken until either a predetermined number of samples have been collected or the tester determines that the engine has started.

These and other advantages of the present invention will become more apparent from a detailed description of the invention.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below, serve to example the principles of this invention, wherein:

FIG. 3A is a schematic block diagram showing more detail about one implementation of a detection circuit according to the present invention;

FIGS. 3B–3F are schematic diagrams showing equivalent circuits of a portion of the detection circuit of FIG. 3A showing the detection circuit of FIG. 3A in various use configurations;

FIG. 4D is a schematic diagram illustrating the an AC voltage amplifier/converter circuit of the battery tester component of the present invention;

FIGS. 11A–11D are a low-level flow chart/state diagram showing the operation of the test routine of the embodiment of the starting/charging system tester of the present invention;

DETAILED DESCRIPTION OF THE INVENTION

Figure 1A:
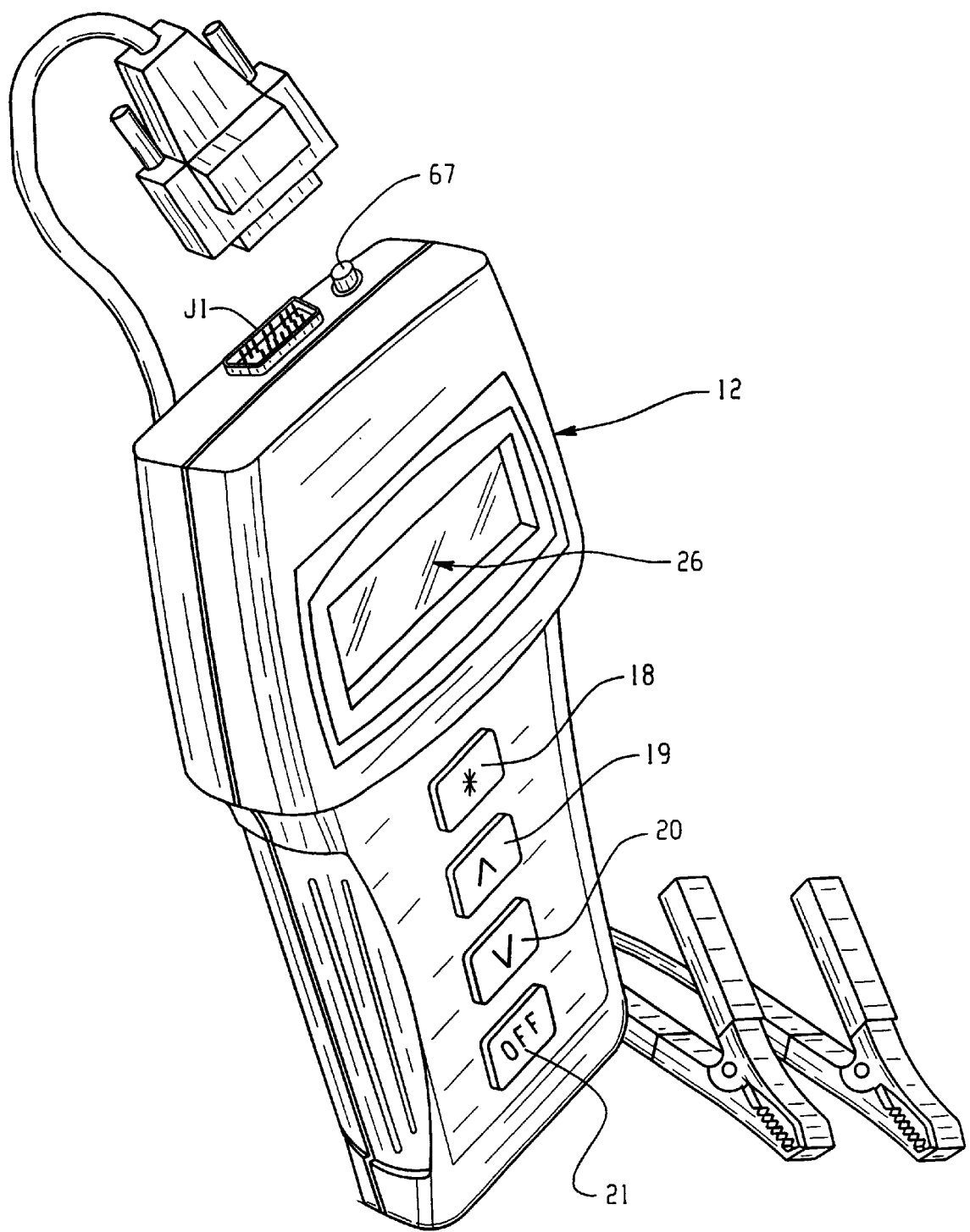
FIG. 1A is an isometric view of an embodiment of the starting/charging system tester according to present invention.
Figure 1B:
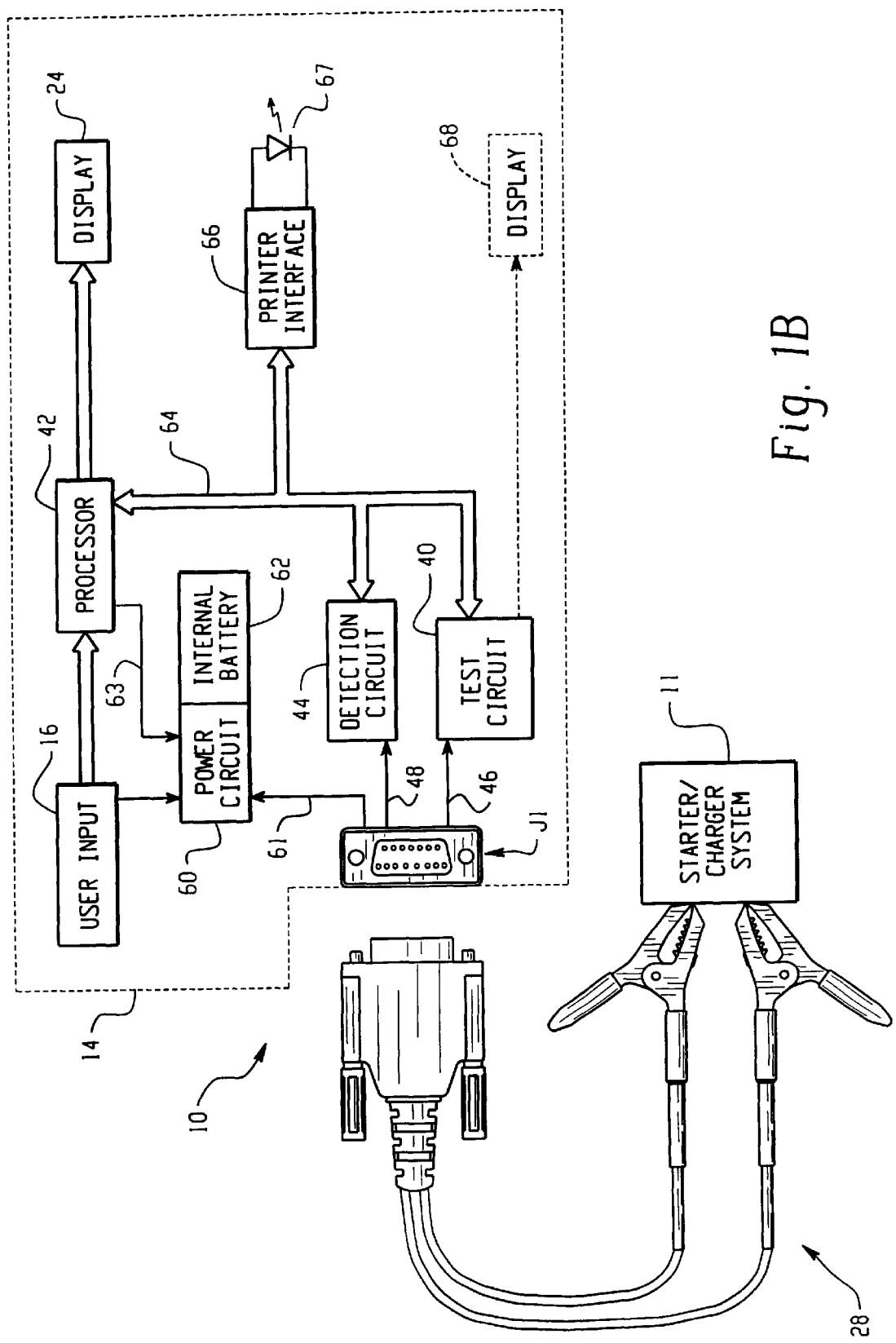
FIG. 1B is a high-level block diagram showing an embodiment of the starting/charging system tester according to the present invention.

Referring to FIGS. 1A and 1B, there is shown a handheld, portable tester 10 according to the present invention for testing a starting/charging system 11. The tester 10 comprises a handheld, portable enclosure 12 housing an electronic circuit 14 that, among other things, tests the starting/charging system 11. One or more user inputs 16, shown in FIG. 1A as four momentary switches implemented as pushbuttons 18–21, allow a user to interface with the tester 10. A display 24, shown in FIG. 1A as a liquid crystal display (LCD) 26 having four lines of twenty characters each, allows the tester 10 to display information to the user.

The tester 10 is placed in circuit communication with the starting/charging system 11 via a cable 28. "Circuit communication" as used herein indicates a communicative relationship between devices. Direct electrical, electromagnetic, and optical connections and indirect electrical, electromagnetic, and optical connections are examples of circuit communication. Two devices are in circuit communication if a signal from one is received by the other, regardless of whether the signal is modified by some other device. For example, two devices separated by one or more of the following—amplifiers, filters, transformers, optoisolators, digital or analog buffers, analog integrators, other electronic circuitry, fiber optic transceivers, or even satellites—are in circuit communication if a signal from one is communicated to the other, even though the signal is modified by the intermediate device(s). As another example, an electromagnetic sensor is in circuit communication with a signal if it receives electromagnetic radiation from the signal. As a final example, two devices not directly connected to each other, but both capable of interfacing with a third device, e.g., a CPU, are in circuit communication. Also, as used herein, voltages and values representing digitized voltages are considered to be equivalent for the purposes of this application and thus the term "voltage" as used herein refers to either a signal, or a value in a processor representing a signal, or a value in a processor determined from a value representing a signal. Additionally, the relationships between measured values and threshold values are not considered to be necessarily precise in the particular technology to which this disclosure relates. As an illustration, whether a measured voltage is "greater than" or "greater than or equal to" a particular threshold voltage is generally considered to be distinction without a difference in this area with respect to implementation of the tests herein. Accordingly, the relationship "greater than" as used herein shall encompass both "greater than" in the traditional sense and "greater than or equal to." Similarly, the relationship "less than" as used herein shall encompass both "less than" in the traditional sense and "less than or equal to." Thus, with A being a lower value than B, the phrase "between A and B" as used herein shall mean a range of values (i) greater than A (in the traditional sense) and less than B (in the traditional sense), (ii) greater than or equal to A and less than B (in the traditional sense), (iii) greater than A (in the traditional sense) and less than or equal to B, and (iv) greater than or equal to A and less than or equal to B. To avoid any potential confusion, the traditional use of these terms "greater than and "less than," to the extent that they are used at all thereafter herein, shall be referred to by "greater than and only greater than" and "less than and only less than," respectively.

Important with respect to several advantages of the present invention, the tester 10 includes a connector J1 to which test cable 28 is removably connected. Having the test cable 28 be removably connected to the tester 10 among other things (i) permits different test cables (cables of FIGS. 5A, 7A, and 8) to be used with a single tester thereby allowing a wider range of functions to be performed with the tester 10, (ii) permits an optional extender cable (cable of FIGS. 6A and 6B) to be used, thereby allowing the tester 10 to be used by one person sitting in a driver's seat for some tests, but allowing a shorter cable (FIG. 5A) to be used for others, and (iii) allows the tester 10 to be stored separately from the cable.

Referring more specifically to FIG. 1B, the tester 10 of the present invention preferably includes an electronic test circuit 14 that tests the starting/charging system 11, which test circuit 14 preferably includes a discrete test circuit 40 in circuit communication with an associated processor circuit 42. In the alternative, the test circuit 14 can consist of discrete test circuit 40 without an associated processor circuit. In either event, preferably, the tester 10 of the present invention also includes a detection circuit 44 in circuit communication with the test circuit 40 and/or the processor circuit 42. The test circuit 40 preferably accepts at least one test signal 46 from the starting/charging system 11 via the cable 28 and connector J1. The detection circuit 44 preferably accepts at least one detection signal 48 from the tester cable 28 or other device (e.g., sensor cable of FIG. 8) placed in circuit communication with the tester 10 via connector J1. Tester 10 also preferably includes a power circuit 60 allowing the tester 10 to be powered by either the starting/charging system 11 via power connection 61 or by an internal battery 62.

The processor circuit 42, also referred to herein as just processor 42, may be one of virtually any number of processor systems and/or stand-alone processors, such as microprocessors, microcontrollers, and digital signal processors, and has associated therewith, either internally therein or externally in circuit communication therewith, associated RAM, ROM, EPROM, clocks, decoders, memory controllers, and/or interrupt controllers, etc. (all not shown) known to those in the art to be needed to implement a processor circuit. One suitable processor is the SAB-C501G-L24N microcontroller, which is manufactured by Siemens and available from various sources. The processor 42 is also preferably in circuit communication with various bus interface circuits (BICs) via its local bus 64, e.g., a printer interface 66, which is preferably an infrared interface, such as the known Hewlett Packard (HP) infrared printer protocol used by many standalone printers, such as model number 82240B from HP, and which communicates via infrared LED 67. The user input 16, e.g., switches 18–21, preferably interfaces to the tester 10 via processor 42. Likewise, the display 24 preferably is interfaced to the tester 10 via processor 42, with the processor 42 generating the information to be displayed on the display 24. In addition thereto, or in the alternative, the tester 10 may have a second display 68 (e.g., one or more discrete lamps or light emitting diodes or relays for actuation of remote communication devices) in circuit communication with the test circuit 40.

Figure 2:
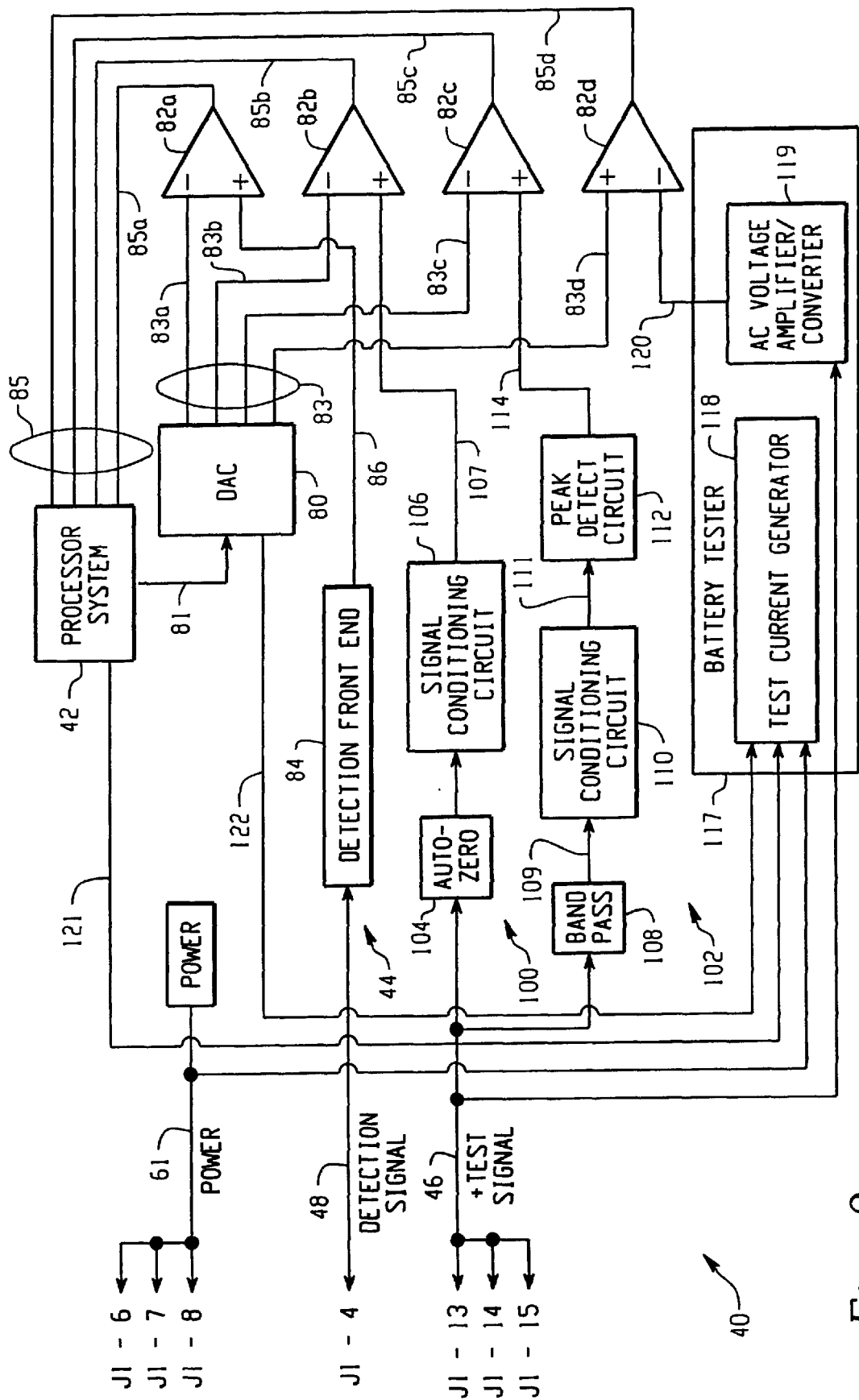
FIG. 2 is a medium-level block diagram showing a detection circuit and a test circuit of an embodiment of the starting/charging system tester according to the present invention.

Referring now to FIG. 2, a more detailed block diagram showing an implementation of the test circuit 40 and detection circuit 44 is shown. In the particular implementation of FIG. 2, the test circuit 40 and detection circuit 44 are implemented using a digital-to-analog converter (DAC) 80 that is in circuit communication with processor 42 via bus 81 and in circuit communication with a number of comparators 82 via reference voltage outputs 83, which comparators 82 in turn are in circuit communication with the processor 42 via test signals 85. Although the test circuit 40 and detection circuit 44 need not be so implemented, having at least a portion of the test circuit 40 be implemented using a DAC 80 and a comparator 82 in circuit communication with the processor 42 provides certain benefits, as explained below.

The detection circuit 44 preferably includes a detection front end 84 and a comparator 82a. The detection front end 84 preferably accepts as an input the detection signal 48 and generates an output 86 to the comparator 82a. Referring to FIG. 3A, a circuit implementation of the detection circuit 44 is shown schematically. The preferred implementation of the detection front end 84 is shown as circuitry 90 to the left of node 92. The circuitry shown includes a connection J1-6, J1-7, J1-8 to the battery of the starting/charging system 11, a PTC F2 (positive temperature coefficient device that acts as a sort of automatically resetting fuse), a diode D7, a voltage divider created by resistors R14 and R15, and a connection to detection signal 48 at J1-4 via resistor R29. The component values are preferably substantially as shown. Processor 42, via bus 81, causes DAC 80 to generate a particular voltage on reference voltage line 83a, which is input to comparator 82a. The detection front end 90 generates a particular detection voltage at node 92, depending on what signals are presented at power signal 61 and detection signal 48. The comparator 82a will output a logical ONE or a logical ZERO to processor 42 depending on the relative values of the reference voltage 83a and the detection voltage at node 92. Thus, to detect which cable 28 or device is attached to connector J1, the processor 42 need only send a command to DAC 80 via bus 81, wait a period of time for the various voltages to stabilize, and read a binary input from input 85a.

Figure 3E:
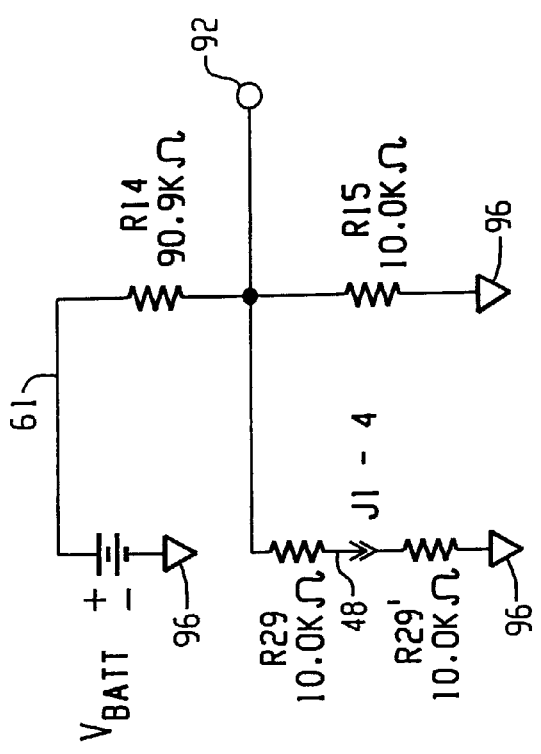
Figure 3F:
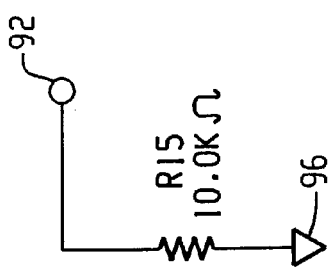
Figure 3D:
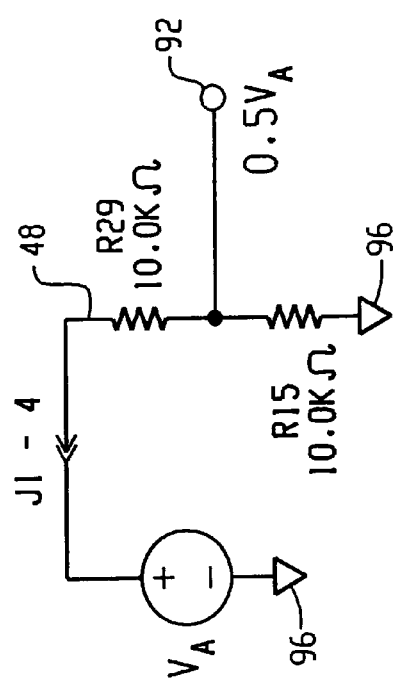

Various connection scenarios for detection front end circuitry 90 are shown in FIGS. 3B–3F, which correspond to various test cables 28 and other signals connected to connector J1. In each, the voltage at node 92 is determined using straightforward, known resistor equations, e.g., resistor voltage divider equations, equivalent resistances for resistors in series, and equivalent resistance for resistors in parallel, etc. In FIG. 3B, the power signal 61 is connected to the battery, which presents a battery voltage $V_{BATT}$, and the detection signal 48 (shown in FIG. 3A) is left as an open circuit; therefore, the test voltage at node 92 is approximately $0.1 \cdot V_{BATT}$, because the battery voltage $V_{BATT}$ is divided by resistors R14 (90.9 KΩ) and R15 (10.0 KΩ). In FIG. 3C, the power signal 61 is connected to the battery, which presents a battery voltage $V_{BATT}$, and the detection signal 48 is grounded to the battery ground; therefore, the test voltage at node 92 is approximately $0.05 \cdot V_{BATT}$, because in this scenario the battery voltage is divided by R14 (90.9 KΩ) and the combination of R15 (10.0 KΩ) and R29 (10.0 KΩ) in parallel (5.0 KΩ combined resistance). In FIG. 3D, the power signal 61 (shown in FIG. 3A) is left as an open circuit, and the detection signal 48 is connected to an applied voltage $V_A$; therefore, the test voltage at node 92 is ½$V_A$, because the applied voltage $V_A$ is divided equally by resistors R29 (10.0 KΩ) and R15 (10.0 KΩ). In FIG. 3E, the power signal 61 is connected to the battery, which presents a battery voltage $V_{BATT}$, and the detection signal 48 is grounded to the battery ground via an additional resistor R29'; therefore, the test voltage at node 92 is the following function Of $V_{BATT}$, $$V_{92} = \frac{Req}{Req + R_{14}} \cdot V_{BATT}$$

where $$Req = \frac{1}{\frac{1}{R15} + \frac{1}{R29 + R29'}}$$

because in this scenario the battery voltage is divided by R14 and the combination of R15 in parallel with R29 and R29' in series, which is about $0.07 \cdot V_{BATT}$ if R29' is 10.0 KΩ. Finally, in FIG. 3F, the power signal 61 (shown in FIG. 3A) is open circuit and the detection signal 48 (shown in FIG. 3A) is open circuit; therefore, the voltage at node 92 is pulled to ground by resistor R15. In all these scenarios, power ground 94 is preferably connected to signal ground 96 either at the negative battery terminal or within test cable 28. The processor 42, DAC 80, and comparator 82a preferably use the known successive approximation method to measure the voltage generated by the detection circuit front end 84.

Thus, in the general context of FIGS. 1A, 1B, 2, and 3A–3F, a specific test cable 28 connected to connector J1 will cause the voltage 86 (i.e., the voltage at node 92) to be a specific voltage, which is measured using the successive approximation method. The processor 42 then preferably determines from that voltage 86 which cable 28 is connected to the tester at connector J1 and executes appropriate code corresponding to the particular cable 28 connected to the connector J1. Various specific connectors 28 are described below in connection with FIGS. 5A–5C, 6A–6B, 7A–7C, and 8.

Referring back to FIG. 2, the test circuit 40 preferably includes a voltmeter circuit 100 and a diode ripple circuit 102. The voltmeter circuit 100 is preferably implemented using a DAC 80 and comparator 82b, to facilitate testing the starting portion of the starting/charging system 11. In the preferred embodiment, the voltmeter circuit 100 comprises an autozero circuit 104 in circuit communication with a signal conditioning circuit 106. The autozero circuit 104 preferably accepts as an input the test signal 46. The signal conditioning circuit 106 generates a test voltage 107 that is compared to a reference voltage 83b by comparator 82b, which generates test output 85b. Similarly, the diode ripple circuit 102 is preferably implemented using a DAC 80 and comparator 82c. In the preferred embodiment, the diode ripple circuit 102 comprises a bandpass filter 108 in circuit communication with a signal conditioning circuit 110, which in turn is in circuit communication with a peak detect circuit 112. The diode ripple circuit 102 accepts as an input the test signal 46. The peak detect circuit 112 generates a test voltage 114 that is compared to a reference voltage 83c by comparator 82c, which generates test output 85c.

Figure 4A:
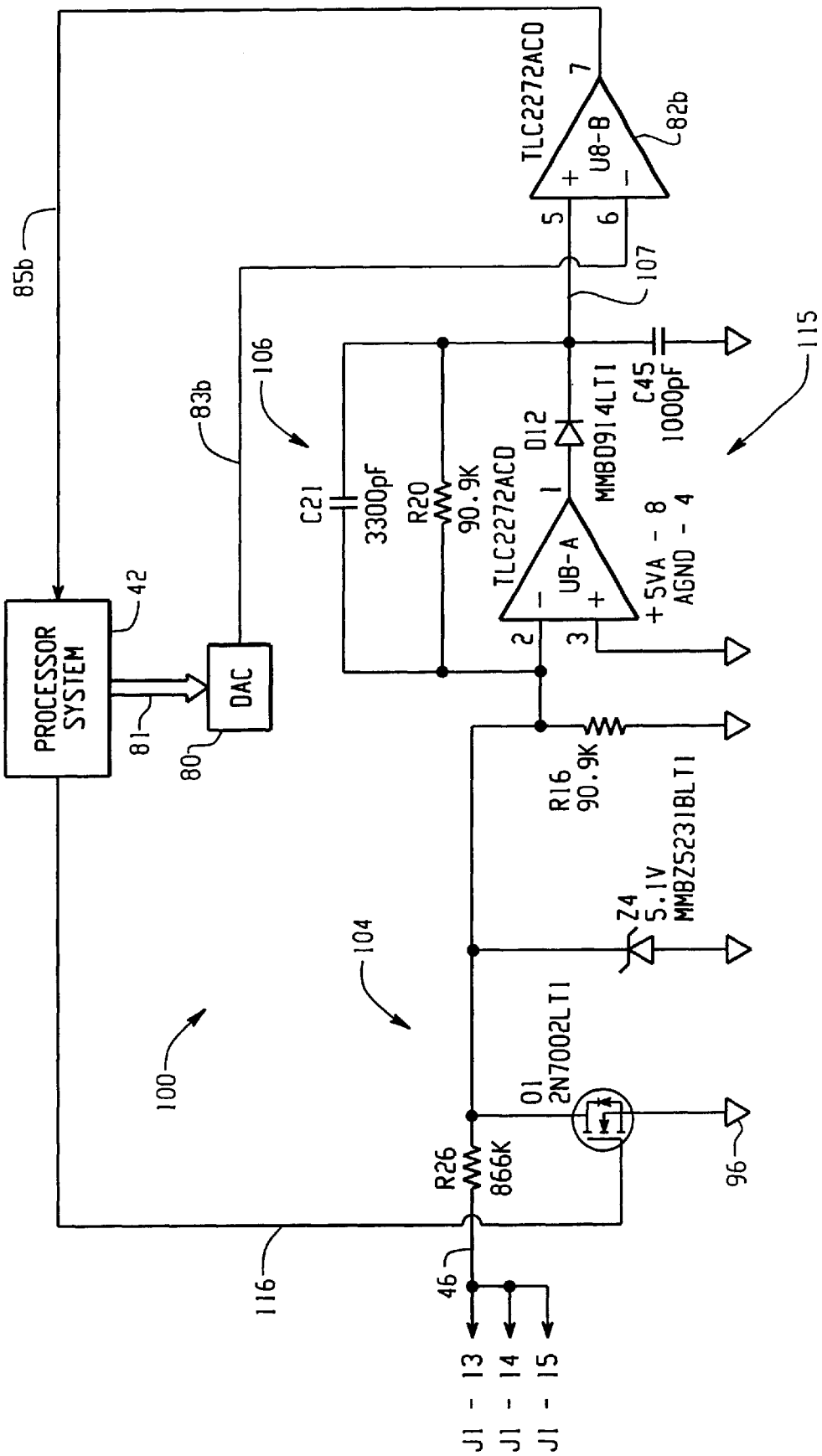
FIG. 4A is a schematic block diagram showing more detail about one implementation of a voltmeter test circuit of the starting/charging system tester according to the present invention.

Referring now to FIG. 4A, a schematic block diagram of a preferred embodiment of the voltmeter circuit 100 is shown. The signal conditioning circuit 106 preferably comprises a protective Zener diode Z4 and amplifier circuit 115. Amplifier circuit 115 preferably comprises an operational amplifier U8-A and associated components resistor R16, resistor R20, capacitor C21, capacitor C45, and diode D12, connected in circuit communication as shown. Amplifier circuit 115 generates test signal 107 as an input to comparator 82b. The processor 42, DAC 80, amplifier circuit 115, and comparator 82b preferably use the known successive approximation method to measure the voltage input to the amplifier 115, which is either the signal 46 or a ground signal generated by the autozero circuit 104 responsive to the processor 42 activating transistor Q1. After using the successive approximation method, the processor 42 has determined a value corresponding to and preferably representing the voltage at 46. The autozero circuit 104 preferably comprises a transistor Q1 in circuit communication with processor 42 via an autozero control signal 116. Ordinarily, the signal 46 from cable 28 passes through resistor R26 to amplifier 115. However, responsive to the processor 42 asserting a logical HIGH voltage (approximately 5 VDC) onto the autozero control signal 116, transistor Q1 conducts, causing the signal 46 to be pulled to signal ground 96 through resistor R26. As known to those in the art, the voltage measured at signal 107 while the autozero control signal 116 is asserted is used as an offset for voltage measurements taken with voltmeter 100 and is used to offset the value corresponding to and preferably representing the voltage at 46.

Having the voltmeter 100 be implemented in this manner, i.e., with a processor, a DAC, and a comparator, provides several benefits. One benefit is reduced cost associated with not having to have a discrete analog-to-digital converter in the circuit. Another benefit is demonstrated during the test of the starting portion of the starting/charging system 11. In that test, the test circuit 40 waits for the battery voltage to drop to a predetermined threshold value, which indicates that a user has turned the key to start the starter motor. The voltage drops very rapidly because the starter motor presents almost a short circuit to the battery before it begins to rotate. The particular implementation of FIG. 4A facilitates the process of detecting the voltage drop by permitting the processor 42 to set the threshold voltage in the DAC 80 once and then continuously read the input port associated with input 85b from comparator 82b. As the battery voltage drops to the threshold voltage set in DAC 80, the output comparator almost instantaneously changes, indicating to processor 42 that the voltage drop has occurred.

Figure 4B:
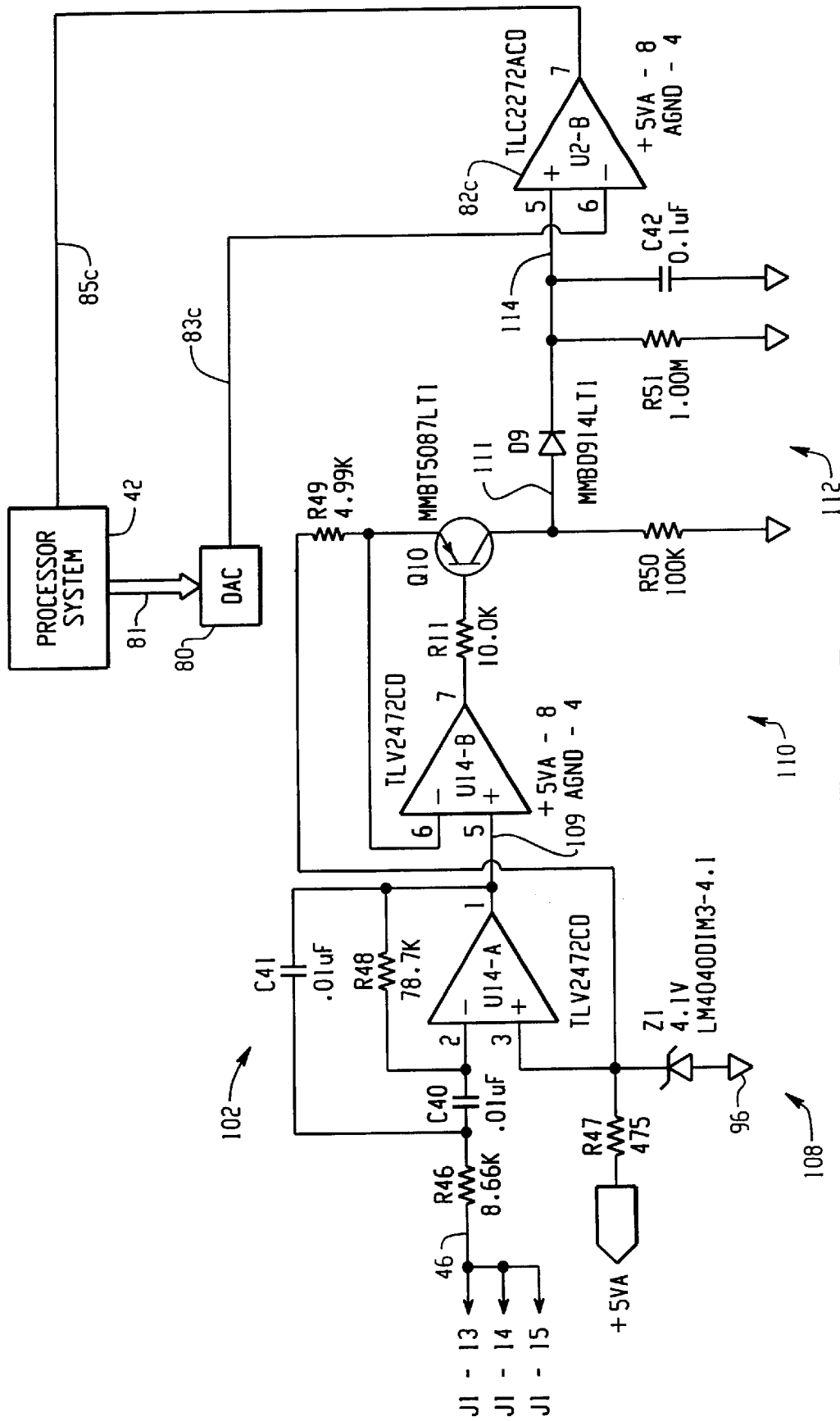
FIG. 4B is a schematic block diagram showing more detail about one implementation of a diode ripple test circuit of the starting/charging system tester according to the present invention.

Referring now to FIG. 4B, a schematic block diagram of the diode ripple circuit 102 is shown. As discussed above, in the preferred embodiment, the diode ripple circuit 102 comprises a bandpass filter 108 in circuit communication with a signal conditioning circuit 110, which in turn is in circuit communication with a peak detect circuit 112. The bandpass filter 108 preferably comprises operational amplifier U14-A and associated components—resistor R46, resistor R47, resistor R48, capacitor C40, capacitor C41, and Zener diode Z1—connected as shown. Zener diode Z1 provides a pseudo-ground for the AC signal component of signal 46. The bandpass filter 108 has a gain of approximately 4.5 and has bandpass frequency cutoff values at approximately 450 Hz and 850 Hz. Signal 109 from bandpass filter 108 is then conditioned using signal conditioner 110. Signal conditioner 110 preferably comprises an amplifier U14-B and a transistor Q10 and associated components—resistor R11, resistor R47, resistor R49, resistor R50, and Zener diode Z1—connected as shown. Signal conditioner circuit 110 generates a DC signal 111 corresponding to the amplitude of the AC signal component of signal 46. The resulting signal 111 is then input to peak detector 112, preferably comprising diode D9, resistor R51, and capacitor C42, connected as shown, to generate signal 114. The signal 114 from the peak detect circuit 112 is measured by the processor 42, DAC 80, and comparator 82c using the successive approximation method. This value is compared to a threshold value, preferably by processor 42, to determine if excessive diode ripple is present. An appropriate display is generated by the processor 42. In the alternative, the signal 85c can be input to a discrete display to indicate the presence or absence of excessive diode ripple.

Referring once again to FIG. 2, test circuit 40 further has a battery tester component 117. The battery tester component 117 includes a test current generator circuit 118 and an AC voltage amplifier/converter circuit 119. The battery tester component 117 is preferably implemented using DAC 80 and a comparator 82d, to facilitate the testing of a battery. The test current generator circuit 118 preferably applies a load current to the battery under test. The AC voltage amplifier/converter circuit 119 measures the voltage generated by the load current applied to the battery. The measuring preferably includes amplifying the voltage and converting it to a ground referenced DC voltage.

Figure 4C:
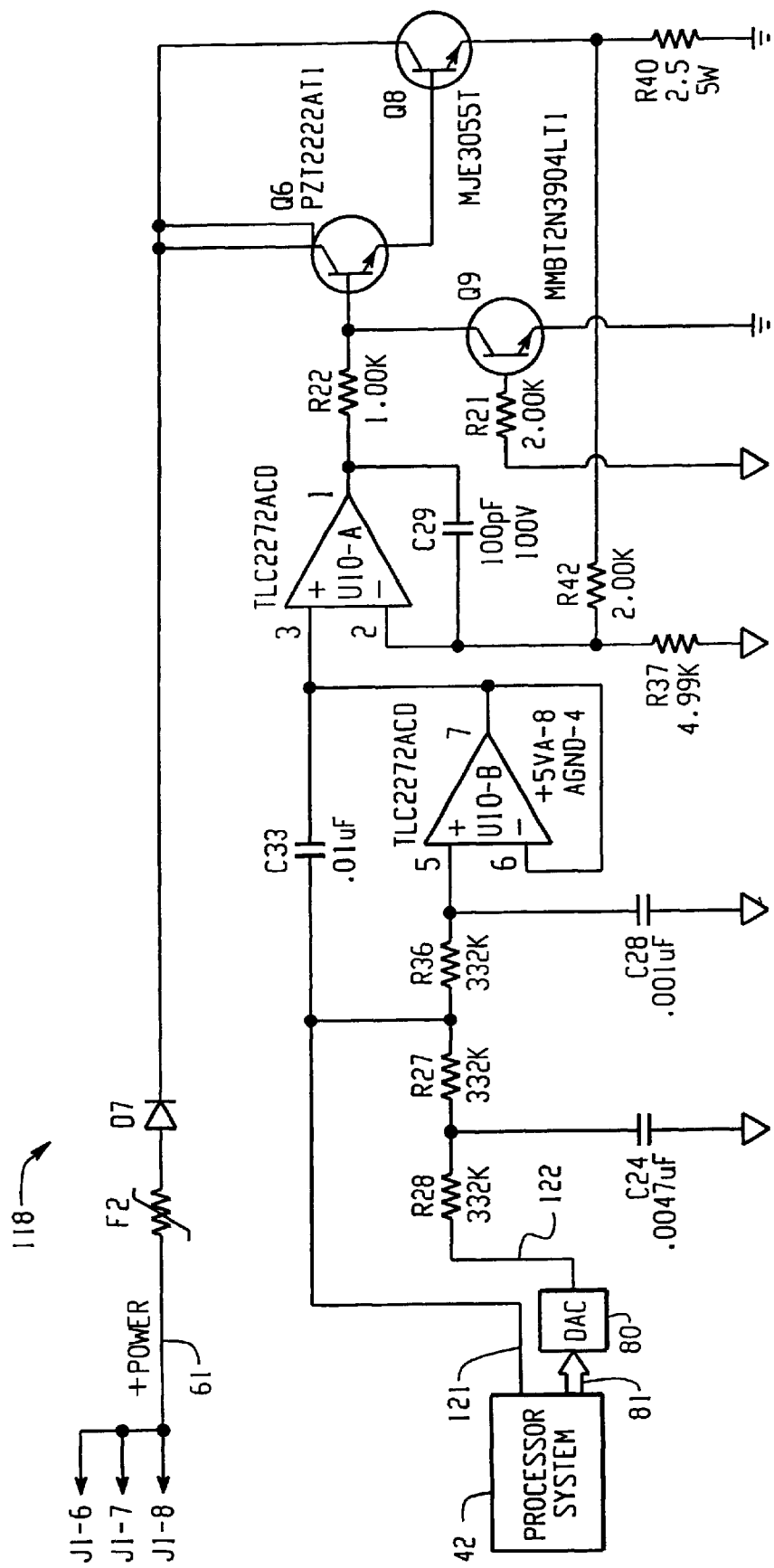
FIG. 4C is a schematic diagram illustrating a test current generator circuit of the battery tester component of the present invention.

In this regard, reference is now made to FIG. 4C where the preferred embodiment of test current generator circuit 118 is illustrated. The circuit 118 includes resistors R21, R22, R27, R28, R36, R37, R40, and R42, capacitors C24, C28, C29, operational amplifiers U10-A and U10-B, and transistors Q6, Q8, and Q9, all interconnected as shown. In operation, processor 42 and DAC 80 together produce a variable voltage pulse signal that is output on node 122. A filter is formed by resistors R28, R27, R36, capacitors C24 and C28 and amplifier U10-B, which converts the signal on node 122 to a sine wave signal. The sine wave signal is applied to a current circuit formed by amplifier U10-A, R22, C29, Q6, Q8, and R40 arranged in a current sink configuration. More specifically, the sine wave signal is applied to the "+" terminal of amplifier Q10-A. The sine wave output of amplifier of Q10-A drives the base terminal of Q6 which, in turn, drives the base terminal of Q8 to generate or sink a sine wave test current. This causes the sine wave test current to be applied to the battery under test through terminal 61 (+POWER). It should also be noted that an enable/disable output 121 from processor 42 is provided as in input through resistor R36 to amplifier U10-B. The enable/disable output 121 disables the test current generator circuit 118 at start-up until DAC 80 has been initialized. Also, a surge suppressor F2 and diode D7 are provided to protect the circuitry from excessive voltages and currents. As described above, the test current generates a voltage across the terminals of the battery, which is measured by AC voltage amplifier/converter circuit 119. This AC voltage is indicative of the battery's internal resistance.

Referring now to FIG. 4D, AC voltage amplifier/converter circuit 119 will now be discussed in more detail. The circuit is formed of two amplifier stages and a filter stage. The first amplifier stage is formed by diodes D3 and D5, resistors R30, R31, R32, R33, R34, amplifier U9-A, and zener diode Z5. The second amplifier stage is formed by resistors R9, R24, R25, and R17, capacitor C27, amplifier U9-B, and transistor Q4. The filter stage is formed by resistors R8, R18, R19, capacitors C15, C17, and C19, and amplifier U7-A.

In operation, the AC voltage to be measured appears on node 46 (+SENSE) and is coupled to amplifier U9-A through C32, which removes any DC components. An offset voltage of approximately 1.7 volts is generated by resistors R33 and R34 and diodes D3 and D5. Resistor R32 and zener diode Z5 protect amplifier U9-A against excessive input voltages. The gain of amplifier U9-A is set by resistors R30 and R31 and is approximately 100. Hence, the amplified battery test voltage is output from amplifier U9-A to the second amplifier stage.

More specifically, the amplified battery test voltage is input through capacitor C27 to amplifier U9-B. Capacitor C27 blocks any DC signal components from passing through to amplifier U9-B. Resistors R9 and R25 and zener diode Z3 bias amplifier U9-B. Coupled between the output and (−) input of amplifier U9-B is the emitter-base junction of transistor Q4. The collector of Q4 is coupled to the ground bus through resistor R17. In essence, the second amplifier stage rectifies the decoupled AC signal using amplifier U9-B and transistor Q4 to invert only those portions of the decoupled AC signal below approximately 4.1 volts and referencing the resulting inverted AC signal, which appears across R17, to the potential of the ground bus. The resulting AC signal is provided downstream to the filter stage.

Input to the filter stage is provided through a resistor-capacitor networked formed by resistors R18, R19, and R8, and capacitors C17 and C19. Amplifier U7-A and feedback capacitor C15 convert the AC input signal at the (+) input of the amplifier U7-A to a DC voltage that is output to node 120. Node 120 provides the DC voltage as an input to the (−) terminal of comparator 82d. The (+) terminal of comparator 82d receives the output of DAC 80 on node 83d. The output of comparator 82d is a node 85d that is in circuit communication with an data input on processor 42. Through DAC 80 and comparator 82d, processor can use a successive approximation technique to determine the amplitude of the DC voltage on node 120 and, therefore, ultimately the internal resistance of the battery under test. This internal resistance value, along with user input information such as the battery's cold-cranking ampere (hereinafter CCA) rating, can determine if the battery passes or fails the test. If the battery fails the test, replacement is suggested. Additional battery tester circuitry can be found in U.S. Pat. Nos. 5,572,136 and 5,585,728, which are hereby fully incorporated by reference.

Figure 5A:
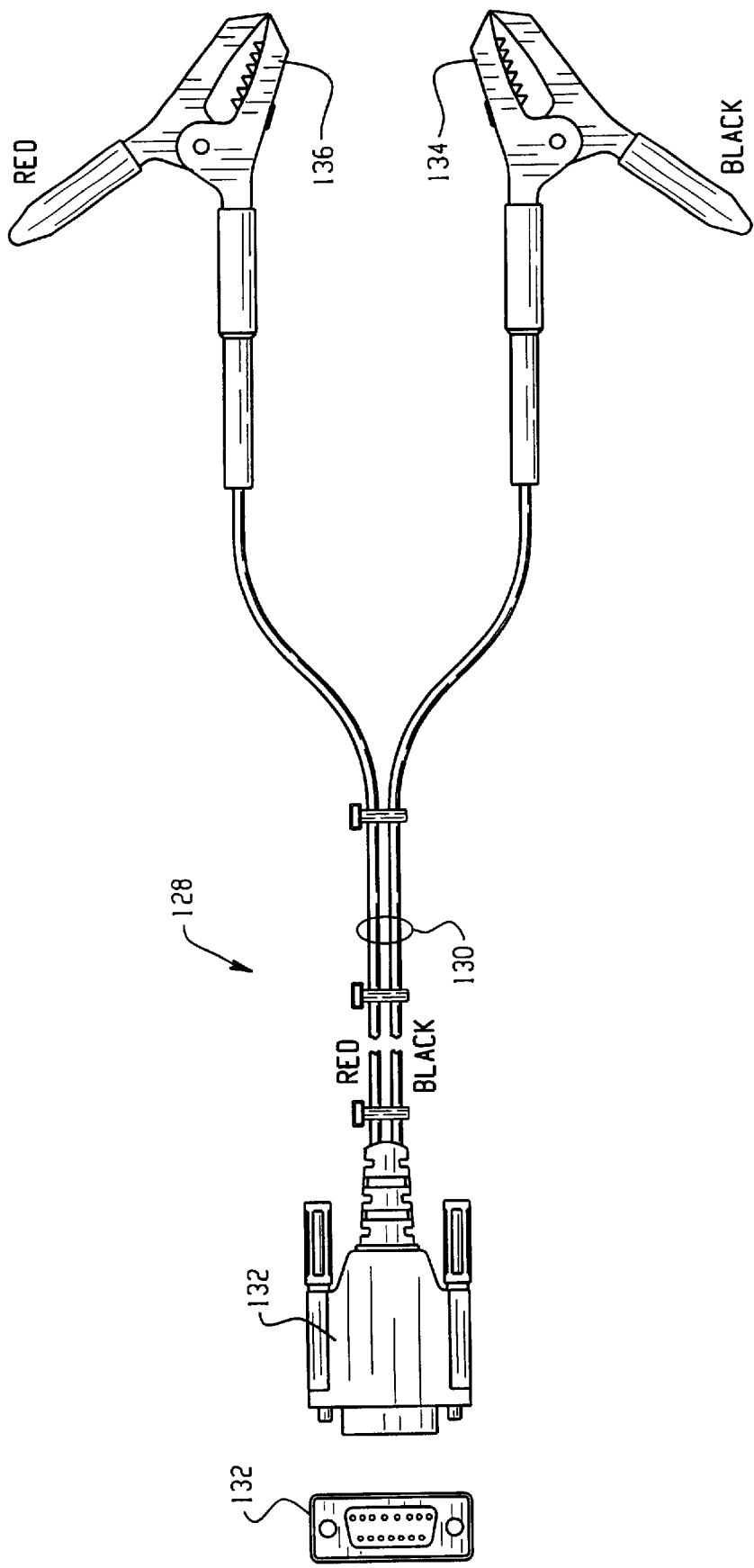
FIG. 5A shows a plan view of one implementation of a clamp cable for the starting/charging system tester according to the present invention.
Figure 5B:
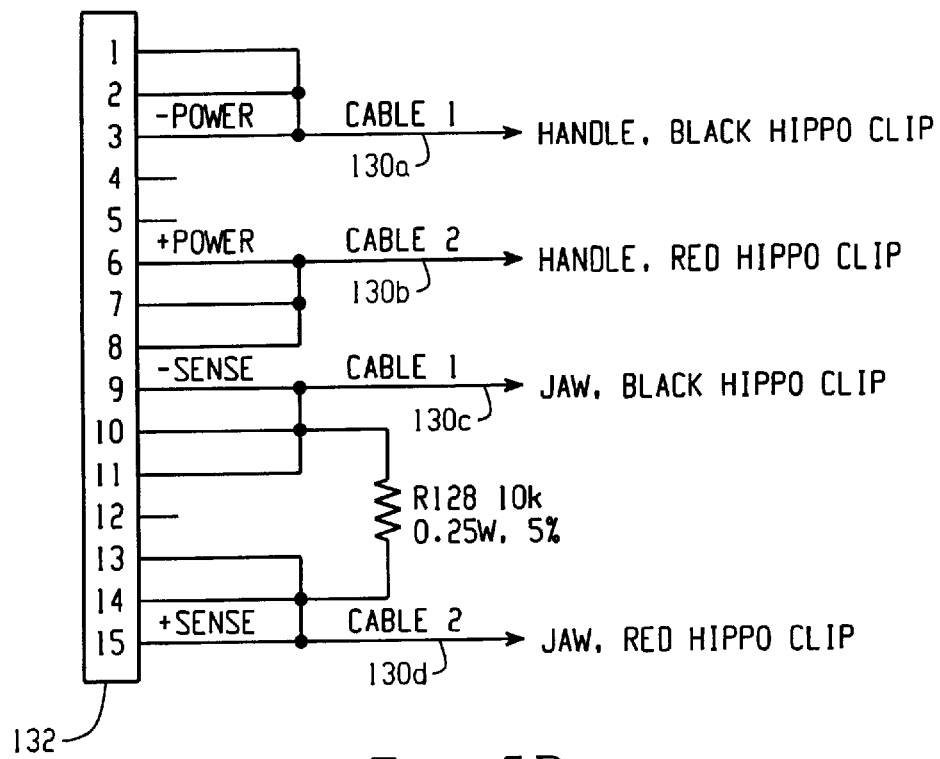
FIG. 5B shows a schematic diagram of connections within the clamp cable of FIG. 5A.
Figure 5C:
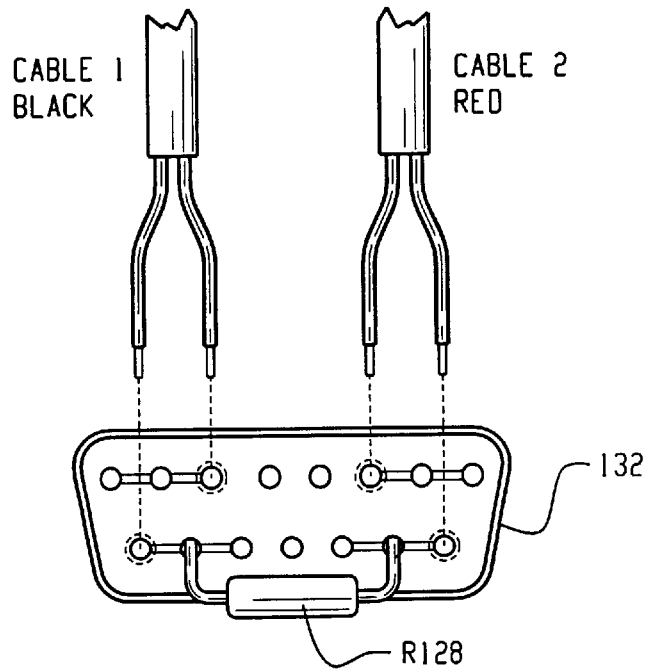
FIG. 5C shows a rear view of the inside of the housing of the clamp cable of FIG. 5A.

Referring now to FIGS. 5A–5C, a two-clamp embodiment 128 of a test cable 28 is shown. The cable 128 of this embodiment preferably comprises a four-conductor cable 130 in circuit communication with a connector 132 at one end, connected as shown in FIGS. 5B and 5C, and in circuit communication with a pair of hippo clips 134, 136 at the other end. The cable 128 is preferably about three (3) feet long, but can be virtually any length. The connector 132 mates with connector J1 of tester 10. The four conductors in cable 130 are preferably connected to the hippo clips 134, 136 so as to form a Kelvin type connection, with one conductor electrically connected to each half of each hippo clip, which is known in the art. In this cable 128, the power ground 94 and signal ground 96 are preferably connected to form a star ground at the negative battery terminal. Resistor R128 connects between the +sense and −sense lines. In test cable 128, pin four (4) is open; therefore, the equivalent circuit of the detection circuit 44 for this cable 128 is found in FIG. 3B. More specifically, with the hippo clips 134, 136 connected to a battery of a starting/charging system 11, and connector 132 connected to mating connector J1 on tester 10, the equivalent circuit of the detection circuit 44 for this cable 128 is found in FIG. 3B. The processor 42 determines the existence of this cable 128 by (i) measuring the battery voltage $V_{BATT}$ using voltmeter 100, (ii) dividing the battery voltage $V_{BATT}$ by ten, and (iii) determining that the voltage at node 92 is above or below a threshold value. In this example the threshold value is determined to be approximately two-thirds of the way between two expected values or, more specifically, $(V_{BATT}/20+V_{BATT}/10.5)/1.5$. If above this value, then cable 128 is connected.

Figure 6A:
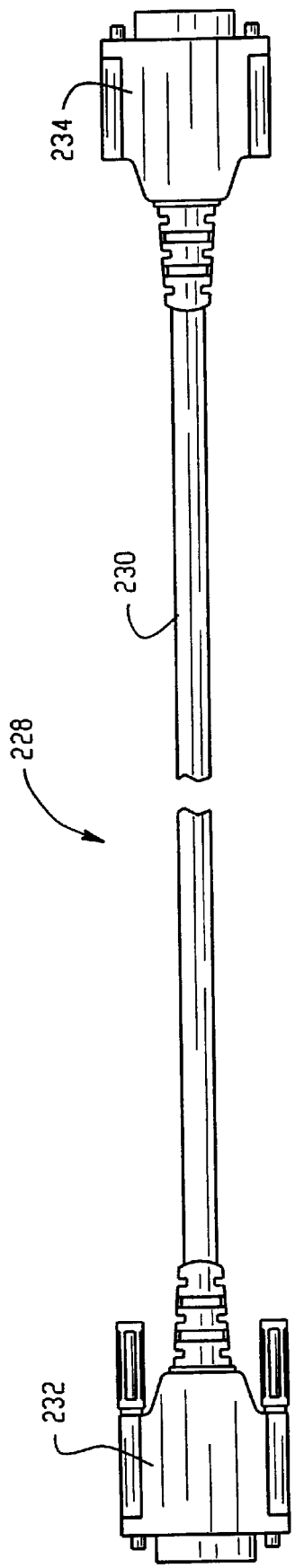
FIG. 6A shows a plan view of one implementation of an extender cable for the starting/charging system tester according to the present invention.
Figure 6B:
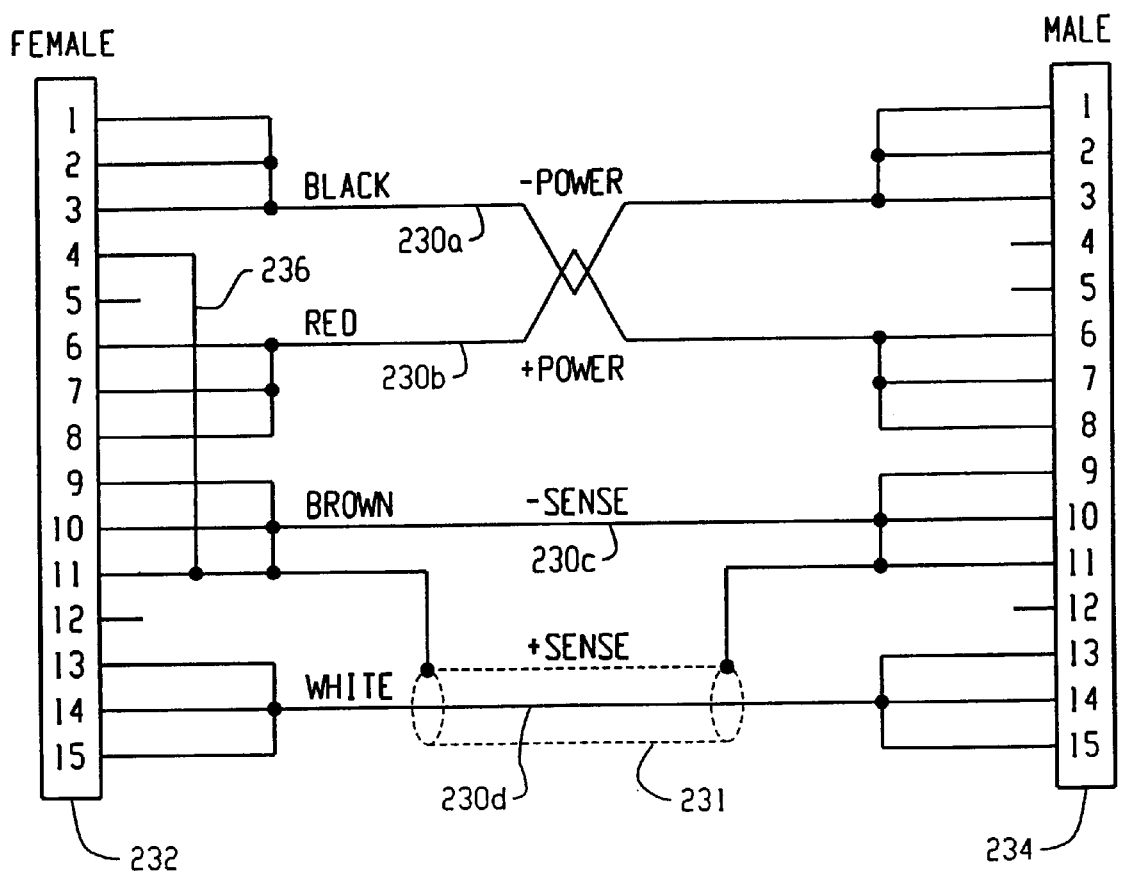
FIG. 6B shows a schematic diagram of connections within the extender cable of FIG. 6A.

Referring now to FIGS. 6A–6B, an embodiment of an extender cable 228 is shown. The cable 228 of this embodiment preferably comprises a four-conductor cable 230 in circuit communication with a first connector 232 at one end and a second connector 234 at the other end, connected as shown in FIG. 6B. The cable 128 is preferably about twelve (12) feet long, but can be virtually any length. Cable conductors 230a and 230b are preferably in a twisted pair configuration. Cable conductor 230d is preferably shielded with grounded shield 231. Connector 232 mates with connector J1 of tester 10. Connector 234 mates with connector 132 of cable 128 of FIGS. 5A–5C (or, e.g., with connector 332 of cable 328 (FIGS. 7A–7C) or with connector 432 of cable 428 (FIG. 8)). In cable 228, the power ground 94 and signal ground 96 are not connected to form a star ground; rather, the extender cable 228 relies on another test cable (e.g., cable 128 or cable 328 or cable 428) to form a star ground. In cable 228, pin four (4) of connector 232 (detection signal 48 in FIG. 3A) is grounded to signal ground 96 (pin eleven (11)) via connection 236; therefore, the equivalent circuit of the detection circuit 44 for this cable 128 is found in FIG. 3C. More specifically, with a cable 128 connected to connector 234, and with the hippo clips 134, 136 of cable 128 connected to a battery of a starting/charging system 111, and connector 232 connected to mating connector J1 on tester 10, the equivalent circuit of the detection circuit 44 for this cable combination 128/228 is found in FIG. 3C. The processor 42 determines the existence of this cable 128 by (i) measuring the battery voltage $V_{BATT}$ using voltmeter 100, (ii) dividing the battery voltage $V_{BATT}$ by twenty and, (iii) determining that the voltage at node 92 is above or below a threshold value. In this example the threshold value is determined to be approximately two-thirds of the way between two expected values or, more specifically, $(V_{BATT}/20+V_{BATT}/10.5)/1.5$. If below this value, then cable 128 is connected.

In response to detecting an extended cable combination 128/228, the processor 42 may perform one or more steps to compensate the electronics in the test circuit for effects, if any, of adding the significant length of wiring inside cable 228 into the circuit. For example, voltage measurements taken with voltmeter 100 might need to be altered by a few percent using either a fixed calibration value used for all extender cables 228 or a calibration value specific to the specific cable 228 being used. Such a calibration value might take the form of an offset to be added to or subtracted from measurements or a scalar to be multiplied to or divided into measurements. Such alterations could be made to raw measured data or to the data at virtually any point in the test calculations, responsive to determining that the extender cable 228 was being used.

Figure 7A:
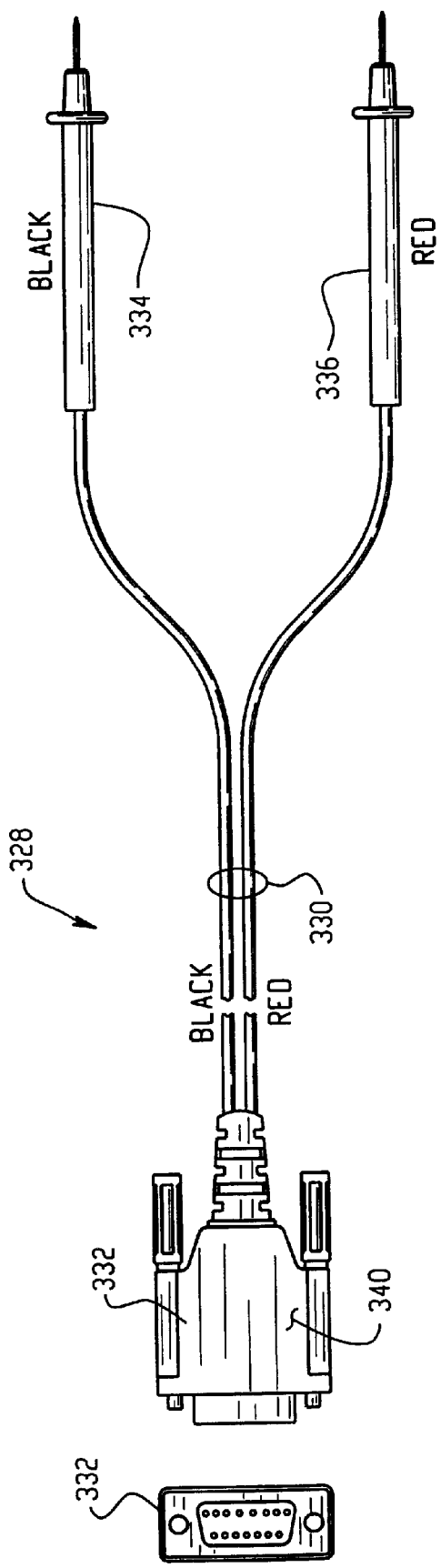
FIG. 7A shows a plan view of one implementation of a probe cable for the starting/charging system tester according to the present invention.
Figure 7B:
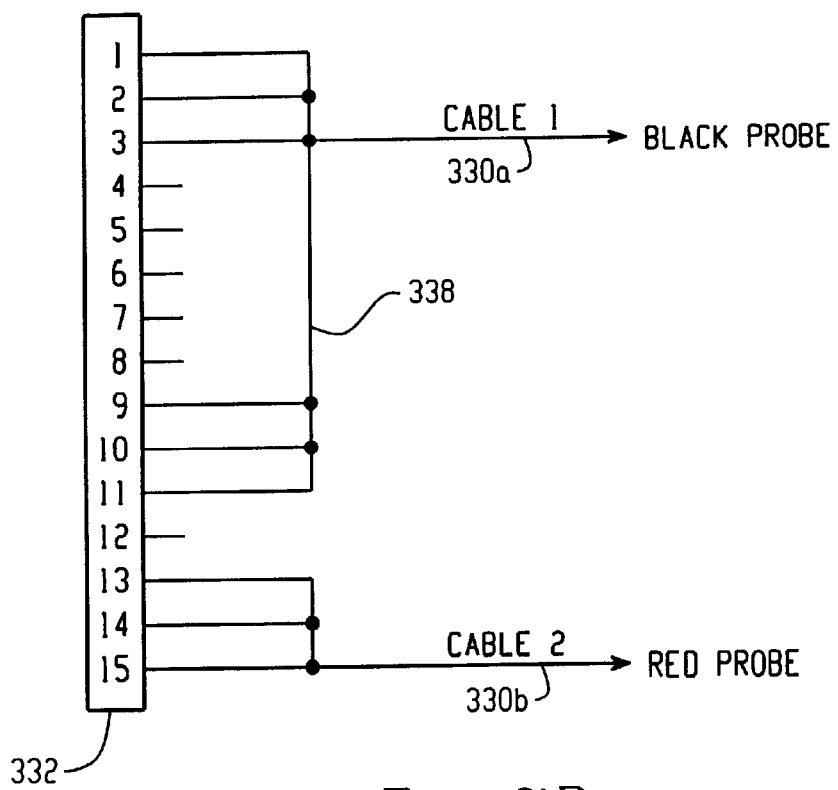
FIG. 7B shows a schematic diagram of connections within the probe cable of FIG. 7A.
Figure 7C:
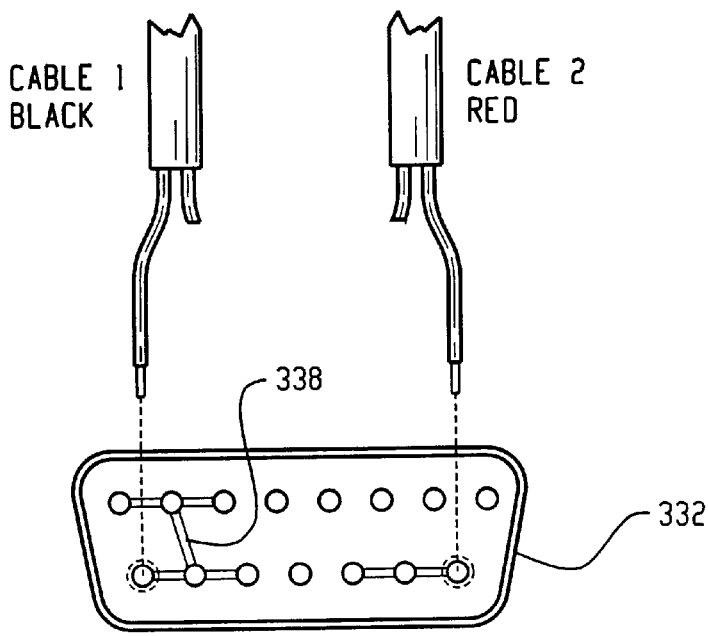
FIG. 7C shows a rear view of the inside of the housing of the probe cable of FIG. 7A.

Referring now to FIGS. 7A–7C, a probe embodiment 328 of a test cable 28 is shown. The cable 328 of this embodiment preferably comprises a two-conductor cable 330 in circuit communication with a connector 332 at one end, connected as shown in FIGS. 7B and 7C, and in circuit communication with a pair of probes 334, 336 at the other end. The cable 328 is preferably about three (3) feet long, but can be virtually any length. The connector 332 mates with connector J1 of tester 10. In this cable 328, the power ground 94 and signal ground 96 are connected by connection 338 inside housing 340 of connector 332 to form a star ground inside housing 340. In cable 328, the battery power signal 48 is open and the detection signal 61 (pin four (4) of connector J1) is open; therefore, the equivalent circuit of the detection circuit 44 for this cable 328 is found in FIG. 3F. More specifically, with connector 332 connected to mating connector J1 on tester 10, the equivalent circuit of the detection circuit 44 for this cable 328 is found in FIG. 3F, i.e., the voltage at node 92 is at zero volts or at about zero volts. The processor 42 determines the existence of this cable 328 by (i) measuring the battery voltage $V_{BATT}$, (ii) dividing the battery voltage $V_{BATT}$ by a predetermined value such as, for example, ten or twenty, and (iii) determining that the voltage at node 92 is above or below a threshold value.

The power circuit 60 allows the tester 10 to power up using the internal battery 62 when using the cable 328 with probes. More specifically, pressing and holding a particular key, e.g., key 21, causes the internal battery 62 to temporarily power the tester 10. During an initial start-up routine, the processor determines the battery voltage using voltmeter 100 and determines that there is no battery hooked up via power line 61. In response thereto, the processor 42 via control signal 63 causes a switch, e.g., a MOSFET (not shown) in power circuit 60 to close in such a manner that the tester 10 is powered by the internal battery 62 after the key 21 is released.

Figure 8:
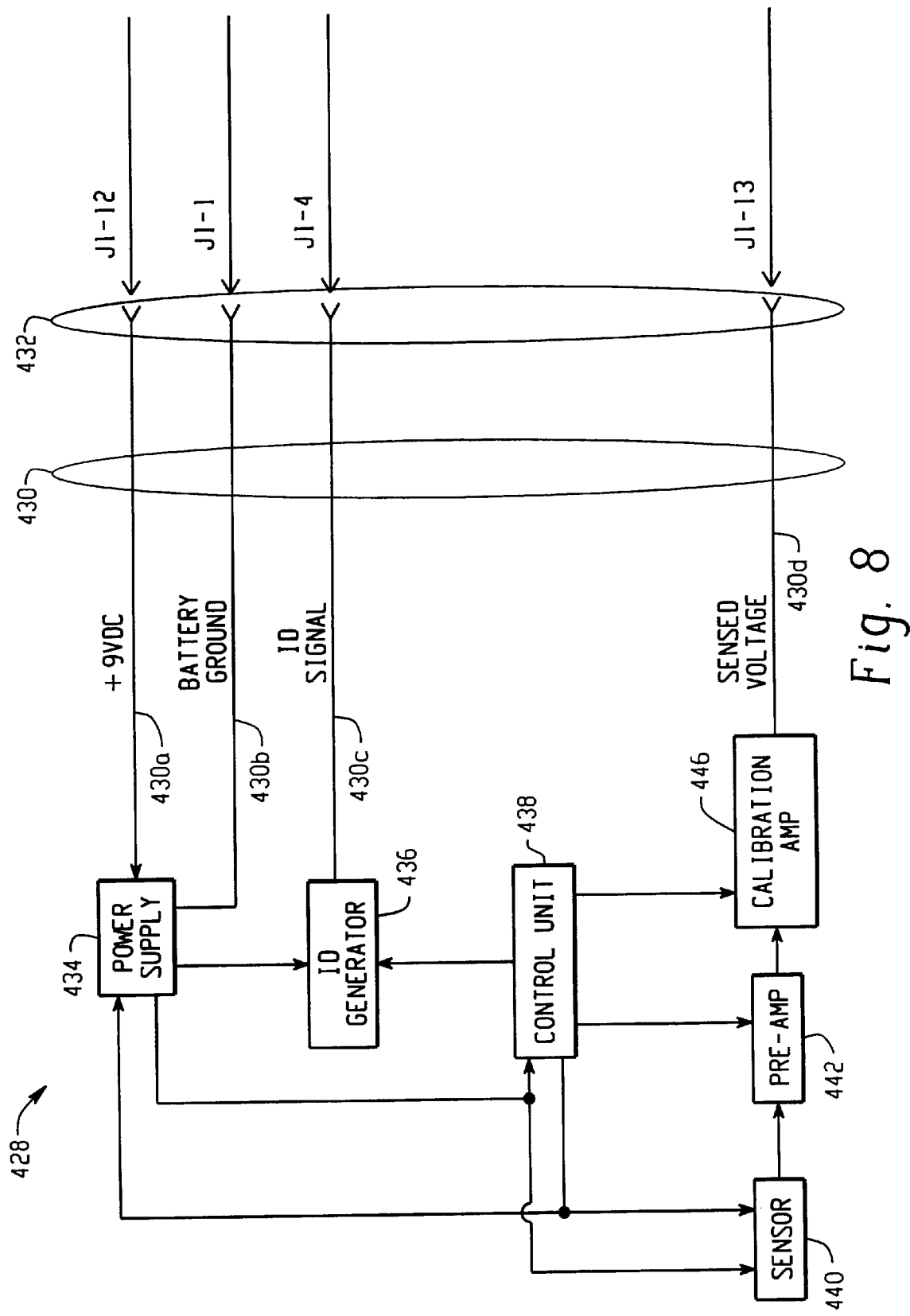
FIG. 8 is a block diagram of a sensor cable, e.g., a current probe, for the starting/charging system tester according to the present invention.

Referring now to FIG. 8, a block diagram of a proposed sensor cable 428 is shown. Sensor cable 428 is preferably an active, powered device and preferably comprises a four-conductor cable 430, a connector 432, a power supply circuit 434, an identification signal generator 436, a control unit 438, a sensor 440, a pre-amp 442, and a calibration amplifier 446, all in circuit communication as shown in FIG. 8. Connector 432 mates with connector J1 of tester 10. Sensor cable 428 may or may not be powered by a battery being tested and may therefore be powered by the internal battery 62 inside tester 10. Accordingly, sensor cable 428 preferably comprises battery power connections 430a, 430b to the internal battery 62. Power supply circuit 434 preferably comprises a power regulator (not shown) to generate from the voltage of battery 62 the various voltages needed by the circuitry in sensor cable 428. In addition, power supply circuit 434 also preferably performs other functions of known power supplies, such as various protection functions. The sensor cable 428 also preferably comprises an identification signal generator 436 that generates an identification signal 430c that interfaces with detection circuit 44 of tester 10 to provide a unique voltage at node 92 for this particular cable 428. Identification signal generator 436 may, for example, comprise a Zener diode or an active voltage regulator (neither shown) acting as a regulator on the internal battery voltage to provide a particular voltage at 430c, thereby causing the detection circuit to behave as in FIG. 3D, with the voltage at node 92 being about half the voltage generated by identification signal generator 436. In the alternative, another circuit of FIGS. 3B–3F may be used to uniquely identify the sensor cable 428. Sensor cable 428 is preferably controlled by control unit 438, which may be virtually any control unit, e.g., discrete state machines, a preprogrammed processor, etc. Control unit 438 preferably controls and orchestrates the functions performed by sensor cable 428. Sensor cable 428 also preferably comprises a sensor 440, e.g., a Hall effect sensor, in circuit communication with a pre-amp 442, which in turn is in circuit communication with a calibration amplifier 446. Calibration amplifier 446 outputs the signal 430d, which is measured by voltmeter 100. Pre-amp 442 and calibration amplifier 446 may be in circuit communication with control unit 438 to provide variable gain control or automatic gain control to the sensor cable 428. The particular identification signal 430c generated by ID generator 436 can be made to change by control unit 438 depending on a particular gain setting. For example, if the sensor 440 is a Hall effect sensor and the sensor cable 428 implements a current probe, the particular identification signal 430c generated by ID generator 436 can be set to one voltage value for an ampere range of e.g. 0–10 Amperes and set to a different voltage value for an ampere range of e.g. 0–1000 Amperes, thereby specifically identifying each mode for the probe and maximizing the dynamic range of the signal 46 for each application. In this type of system, the processor 42 would need to identify the type of cable attached before each measurement or periodically or in response to user input.

Figure 9:
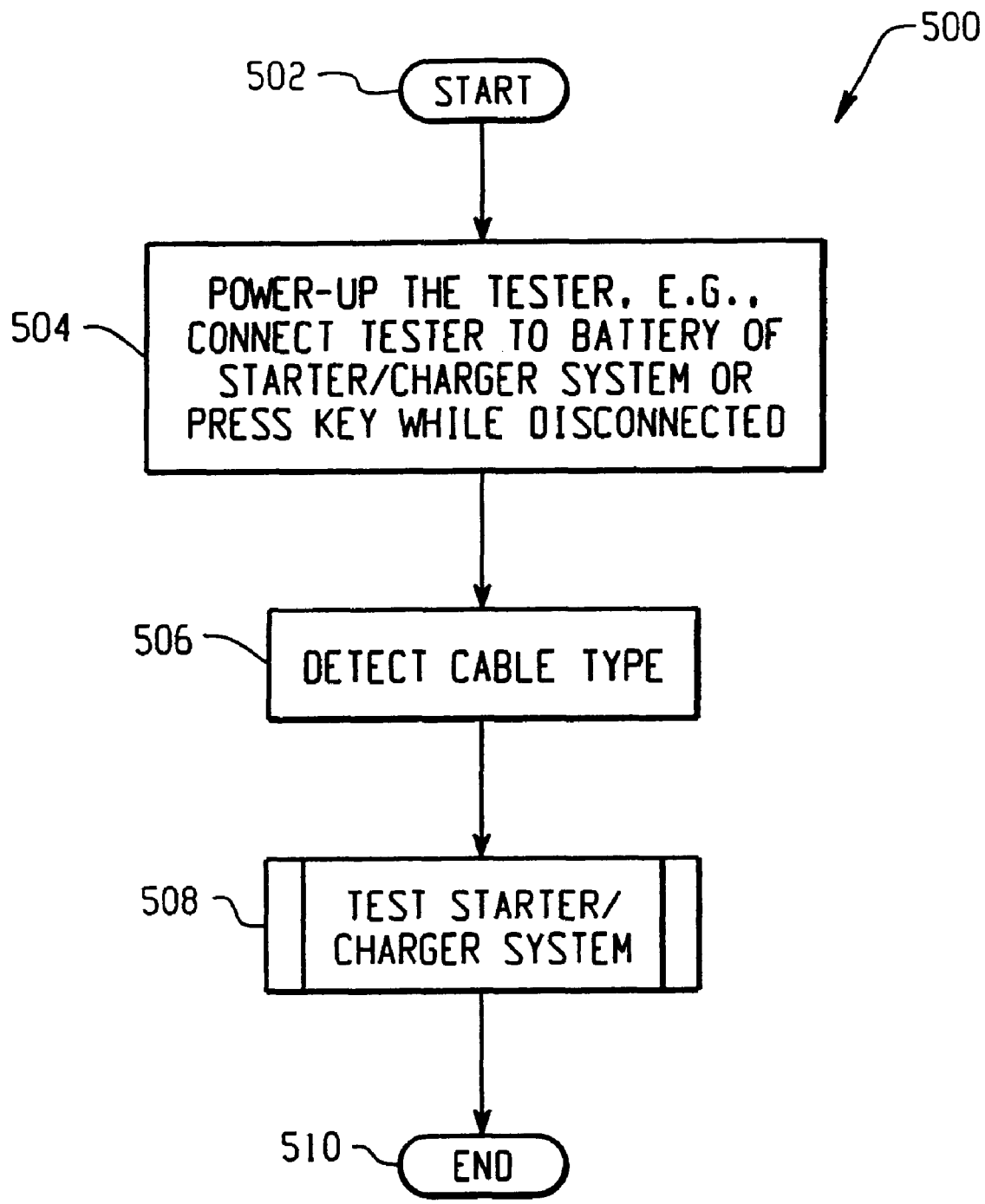
FIG. 9 is a high-level flow chart showing some of the operation of the embodiment of the starting/charging system tester of the present invention.

Referring now to FIG. 9 in the context of the previous figures, a very high-level flow chart 500 for the operation of tester 10 is shown. The tasks in the various flow charts are preferably controlled by processor 42, which has preferably been preprogrammed with code to implement the various functions described herein. The flow charts of FIGS. 9–12 are based on a tester 10 having a hippo clip cable 128 connected to an extender cable 228, which in turn is connected to tester 10 at connector J1. Starting at task 502, the user first powers up the tester 10 at task 504 by connecting the tester 10 to a battery of a starting/charging system 11. If the tester 10 is to be powered by internal battery 62, the user presses and holds the button 21 until the processor 42 latches the battery 62, as described above. In response to the system powering up, the processor 42 initializes the tester 10, e.g., by performing various self-tests and/or calibrations, such as autozeroing, described above.

Next, at task 506, the tester 10 detects the type of cable 28 attached to connector J1, e.g., as being one of the cables 128, 228, 328, or 428, discussed above. In general, this is done by having the processor measure the voltage at node 92 using a successive approximation technique with DAC 80 and comparator 82a, comparing the measured value of the voltage at node 92 to a plurality of voltage values, and selecting a cable type based on the measured voltage relative to the predetermined voltage values. One or more of the plurality of voltage values may depend on, or be a function of, battery voltage; therefore, the processor may measure the battery voltage and perform various computations thereon as part of determining the plurality of voltage values such as, for example, those described in connection with FIGS. 5A–7B, above. Then, the user tests the starting/charging system 11, at task 508, and the testing ends at task 510.

Figure 10:
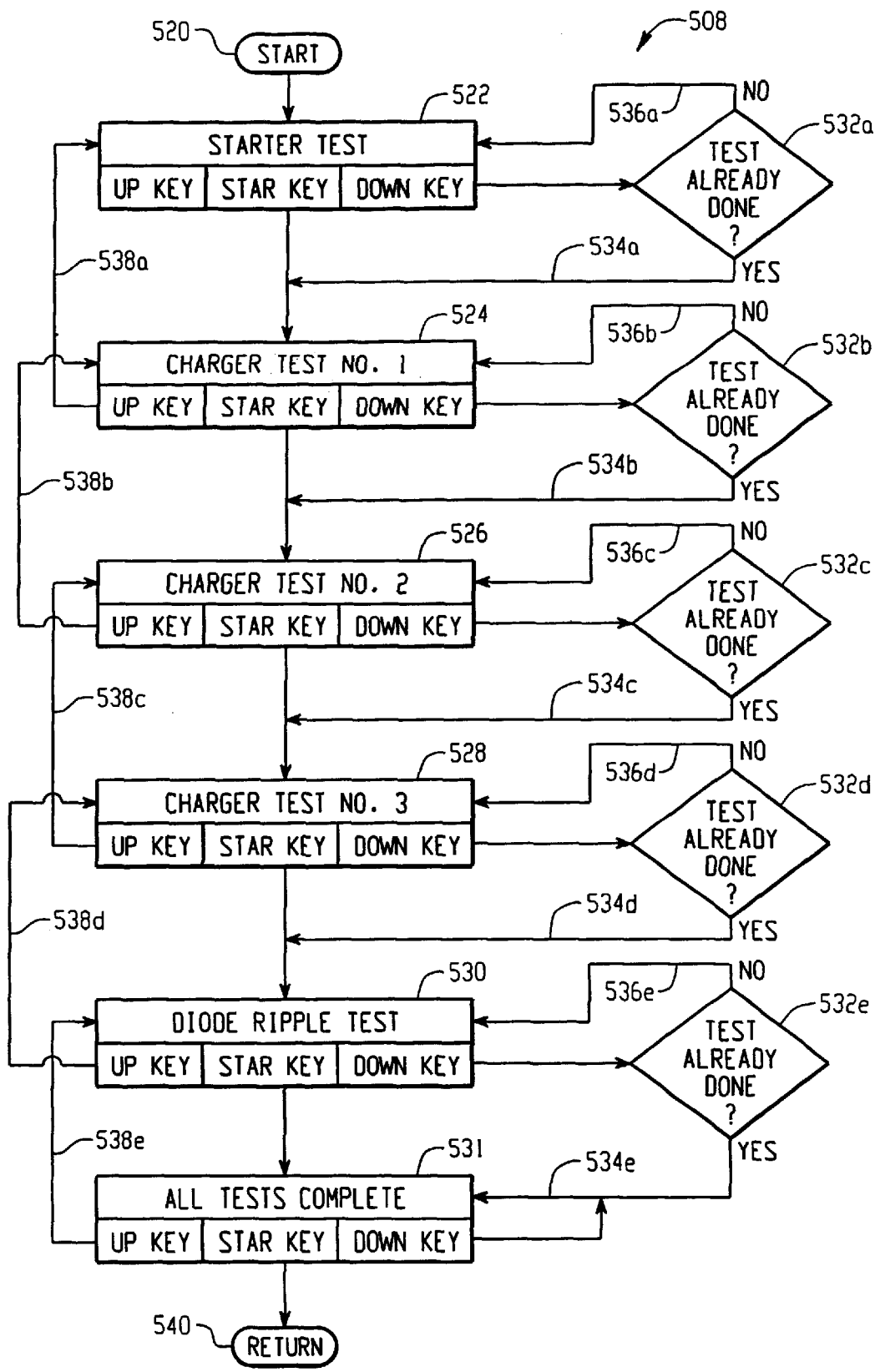
FIG. 10 is a medium-level flow chart/state diagram showing the operation of the test routine of the embodiment of the starting/charging system tester of the present invention.

Referring now to FIG. 10, a medium-level flow chart is presented showing a preferred program flow for the testing of the starting/charging system and also showing some of the beneficial aspects of the user interface according to the present invention. The test routine 508 preferably performs a starter test, a plurality of charger tests, and a diode ripple test. The tester 10 preferably accepts input from the user (e.g., by detecting various keys being pressed) to allow the user to look over results of tests that have already been performed and to either skip or redo tests that have already been performed. In general, preferably the user presses one key to begin a test or complete a test or to indicate to the processor 42 that the vehicle has been placed into a particular state. The user presses a second key to look at the results of previously completed tests and the user presses a third key to skip tests that have already been performed. Code implementing the user interface preferably conveys to the user via the display 24 whether a test may be skipped or not. More specifically to the embodiment shown in the figures, the user presses the star button 18 to cause the processor to begin a test or complete a test or to indicate to the processor 42 that the vehicle has been placed into a particular test state, thereby prompting the processor to take one or more measurements. After one or more tests are performed, the user may press the up button 19 to review the results of tests that have been performed. Thereafter, the user may skip or redo tests that have already been done. The user may skip a test that has already been done by pressing the down button 20.

More particular to FIG. 10, starting at 520, the routine 508 first performs the starter test, at 522. As will be explained below in the text describing FIGS. 11 and 12, for the various tests the user is prompted via the display 24 to place the vehicle into a particular state and to press a key when the vehicle is in that state, then the tester 10 takes one or more measurements, then the data is processed, and then test results are displayed to the user via display 24.

In the preferred embodiment, there are five test states: a starter test state 522, a first charger test state 524, a second charger test state 526, a third charger test state 528, and a diode ripple test state 530. The tester successively transitions from one state to the next as each test is completed. There is also a finished state 531 which is entered after all of the tests are completed, i.e., after the diode ripple test is completed. For each test, preferably the user is prompted via the display 24 to place the vehicle into a particular state, the user presses the star key 18 to indicate that the vehicle is in that state, then the tester 10 takes one or more measurements, then the data is processed, then test results are displayed to the user via display 24, then the user presses the start key 20 to move to the next test. As each test is completed, the processor 42 sets a corresponding flag in memory indicating that that test has been completed. These flags allow the code to determine whether the user may skip a test that has already been performed. As shown, the user presses the star key 18 to move to the next test. As shown in FIG. 10, if the user presses the down key 20 while in any of the various states, the code tests whether that test has been completed, at 532a–532e. If so, the code branches to the next state via branches 534a–534e. If not, the code remains in that state as indicated by branches 536a–536e. If the user presses the up key 19, while in any of states 524–530, the code branches to the previous test state, as indicated by branches 538a–538e. Thus, the user may use the up key 19 to look at previously performed tests, and selectively use either (a) the down key 20 to skip (keep the previously recorded data rather than collecting new data) any particular test that has been performed or (b) the star key 18 to redo any particular test that has already been performed. For example, assume that a vehicle has passed the Starter Test 522, failed Charger Test No. 1 524, passed Charger Test No. 2 526, and passed Charger Test No. 3 528. In this situation, the user may want to redo Charger Test No. 1 without having to redo the other two tests. In that case, the user may hit the up key 19 twice to move from state 528 to the Charger Test No. 1, which is state 524. In that state, the user may perform Charger Test No. 1 again. After performing Charger Test No. 1 again, the user may move to the next test, the Diode Ripple Test 530, by actuating the down key twice (if in state 526) or thrice (if still in state 524), thereby skipping the Charger Test No. 2 and Charger Test No. 3 and retaining the previously collected data for those tests.

After all the tests are complete, the tester 10 enters the All Tests Complete state 531. While in this state, the user may actuate the up key 19 to view one or more previously completed tests or may actuate the star key 18 to return, at 540.

Figure 11A:
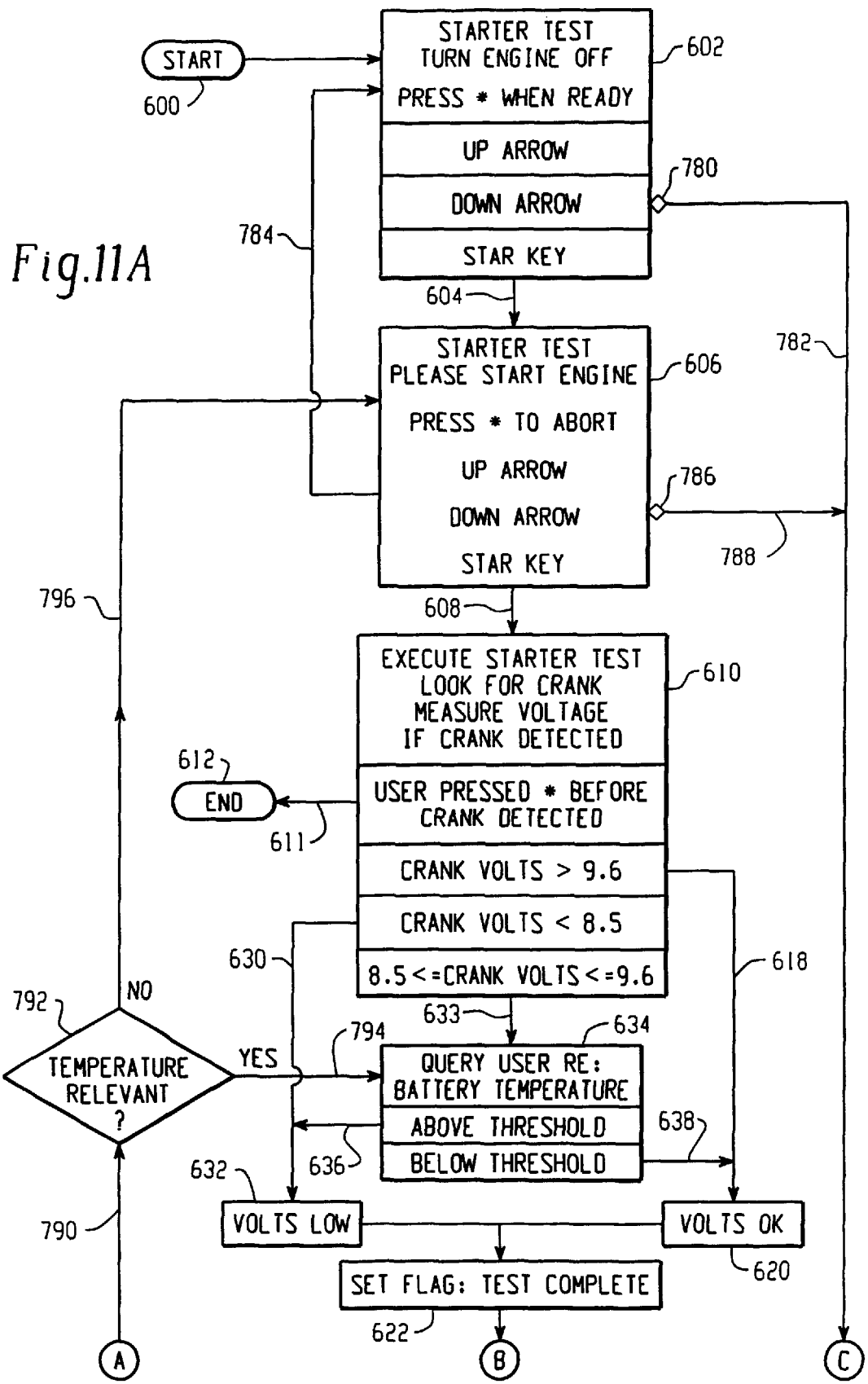
Figure 11B:
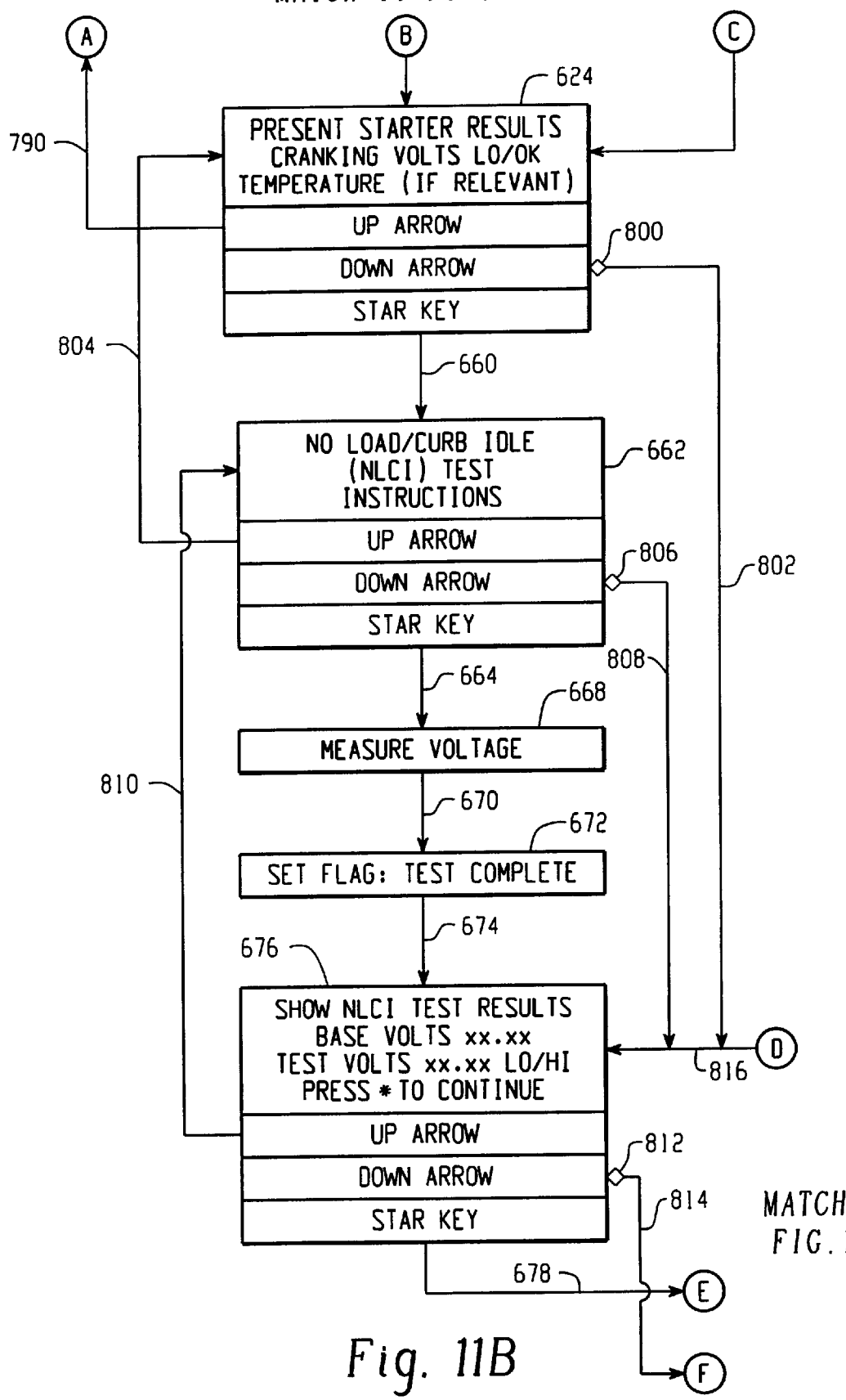
Figure 11C:
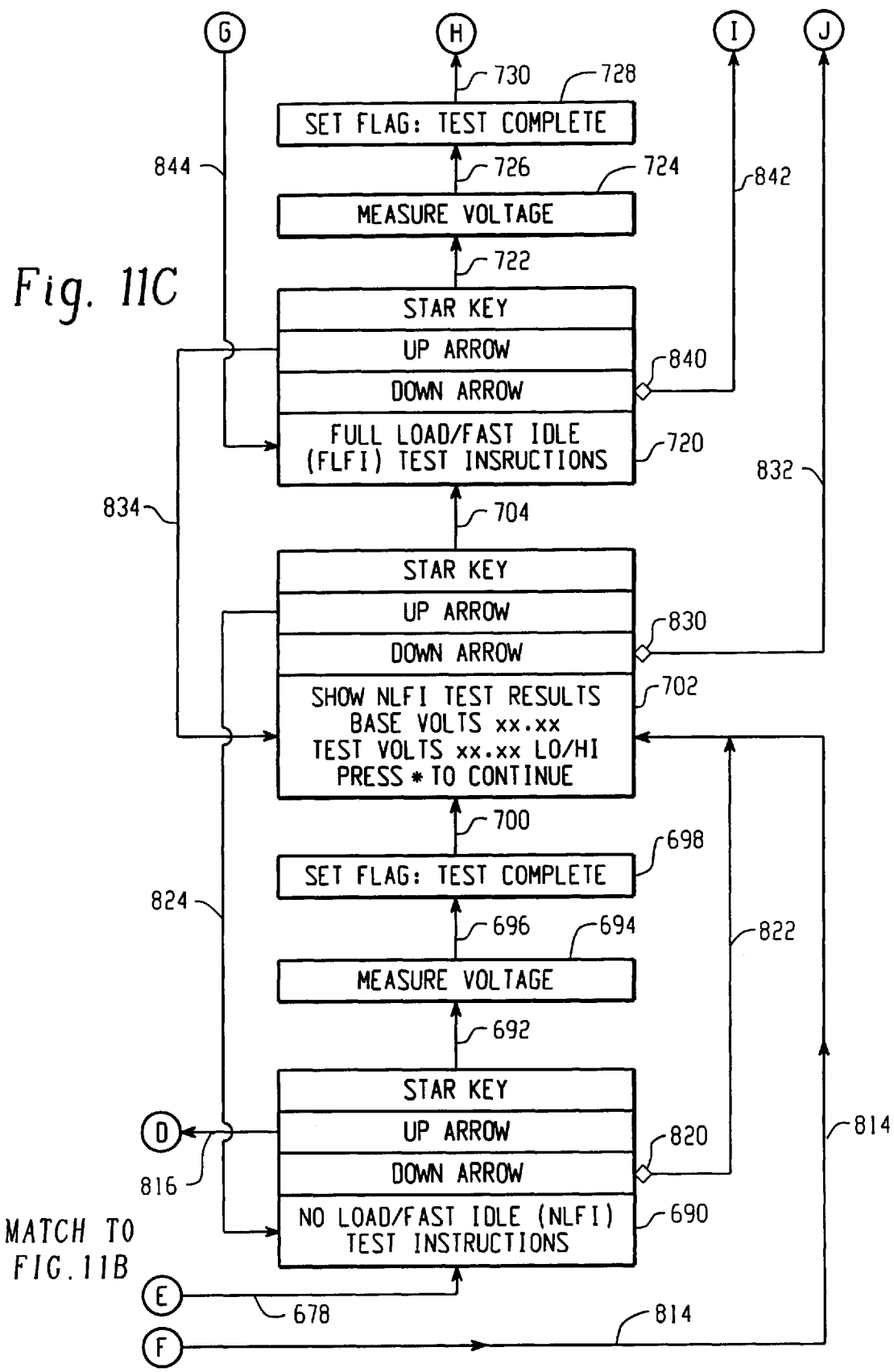
Figure 12:
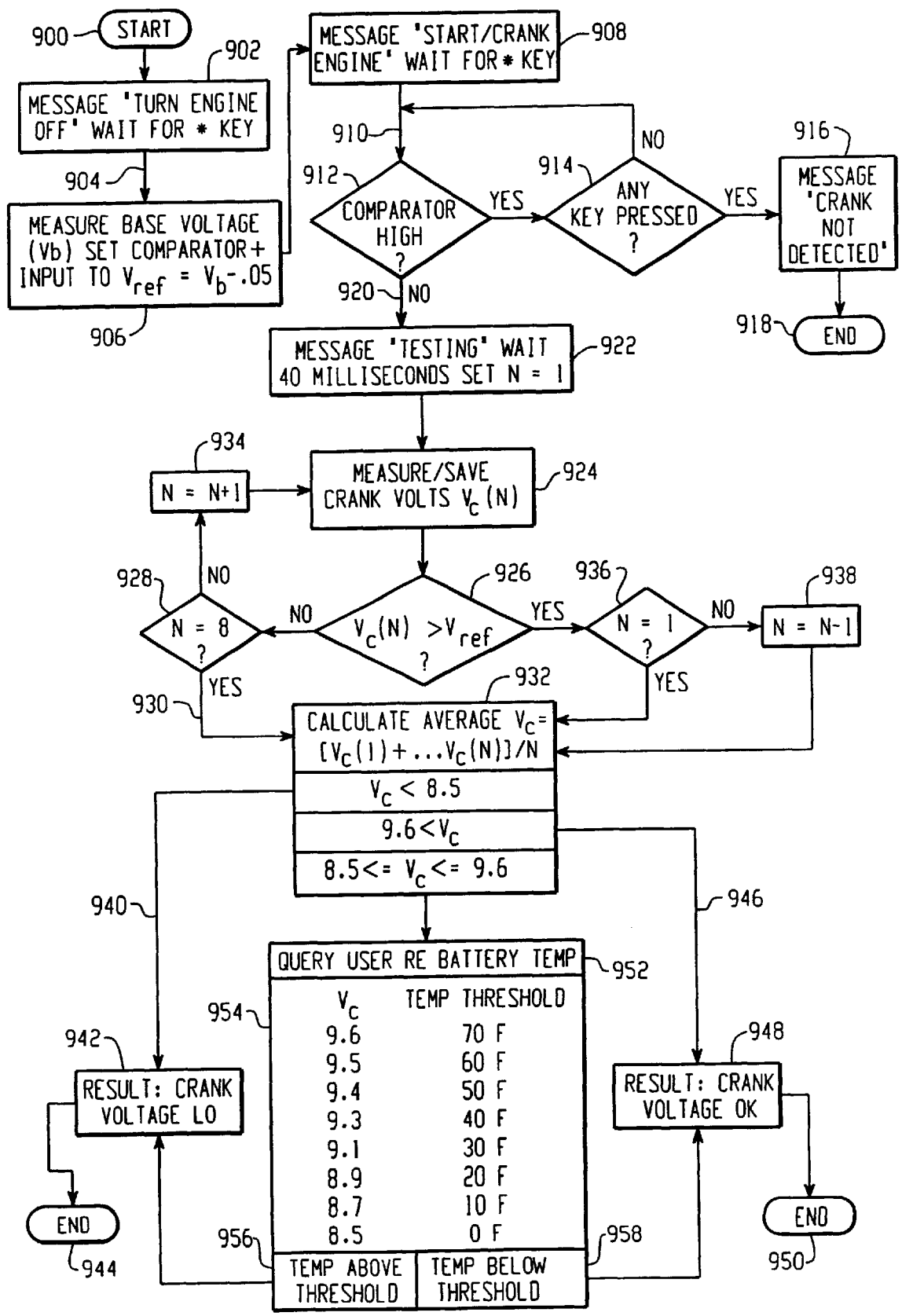
FIG. 12 is a low-level flow chart showing the operation of the starter test routine of an embodiment of the starting/charging system tester of the present invention.

Referring now to FIGS. 11A–11D and 12, additional aspects of the routines discussed in connection with FIG. 10 are shown. FIGS. 11A–11D are set up similarly to FIG. 10; however, the symbols representing the decisions at 532a–532e and branches at 536a–536e in FIG. 10 have been compressed to conserve space in FIGS. 11A–11D. FIGS. 11A–11D focus on the user interface of the present invention and provide additional information about the various tests. FIG. 12 provides additional information about the starter test while de-emphasizing the user interface. The small diamonds extending to the right from the various "down arrow" boxes in FIGS. 11A–11D represent those decisions 532a–532e and branches back to the same state 536a–536e, as will be further explained below.

Starting at 600 in FIG. 11A, the test routine 508 first prompts the user at 602 to turn the engine off and to press the star key 18 when that has been done. The user pressing the star key 18 causes the code to branch at 604 to the next state at 606. At state 606, the user is prompted to either start the engine of the vehicle under test or press the star key 18 to abort the starter test, causing the code to branch at 608 to the next state at 610.

While in state 610, the tester 10 repeatedly tests for the star key 18 being actuated and tests for a drop in the battery voltage indicative of the starter motor starting to crank, as further explained in the text accompanying FIG. 12. If an actuation of the star key 18 is detected, the code branches at 611 and the starter test is aborted, at 612. If a voltage drop indicative of the start of cranking is detected, the tester 10 collects cranking voltage data with voltmeter 100, as further explained in the text accompanying FIG. 12. If the average cranking voltage is greater than 9.6 VDC, then the cranking voltage is deemed to be "OK" no matter what the temperature is, the code branches at 618, sets a flag indicating that the cranking voltage during starting was "OK" at 620, sets a flag indicating that the starter test has been completed at 622, and the corresponding message is displayed at 624. On the other hand, if the average cranking voltage is less than 8.5 VDC, then the battery voltage during starting ("cranking voltage") is deemed to be "Low" no matter what the temperature is, i.e., there might be problems with the starter, the code branches at 630, sets a flag indicating that the cranking voltage during starting was "Low" at 632, sets a Starter Test Complete Flag indicating that the starter test has been completed at 622, and the corresponding message is displayed at 624. Finally, if the average cranking voltage is between 8.5 VDC and 9.6 VDC, then the processor 42 needs temperature information to make a determination as to the condition of the starter, and the code branches at 633. Accordingly, the processor 42 at step 634 prompts the user with respect to the temperature of the battery with a message via display 24 such as, "Temperature above xx°?" where xx is a threshold temperature corresponding to the average measured cranking voltage. A sample table of cranking voltages and corresponding threshold temperatures is found at 954 in FIG. 12. On the one hand, if the user indicates that the battery temperature is above the threshold temperature, then the code branches at 636, sets a flag indicating that the cranking voltage during starting was "Low" at 632, sets the Starter Test Complete Flag indicating that the starter test has been completed at 622, and a corresponding "Low" message is displayed at 624. On the other hand, if the user indicates that the battery temperature is not above the threshold temperature, then the code branches at 638, sets a flag indicating that the cranking voltage during starting was "OK" at 620, sets the Starter Test Complete Flag indicating that the starter test has been completed at 622, and a corresponding "OK" message is displayed at 624. While in state 624, if the user presses the star key 18, the code branches at 660 to state 662.

The No Load/Curb Idle charger test begins at state 662, in which the user is prompted to adjust the vehicle so that the starting/charging system is in a No Load/Curb Idle (NLCI) condition, e.g., very few if any user-selectable loads are turned on and no pressure is being applied to the accelerator pedal. The battery voltage of the vehicle while in the NLCI condition provides information about the condition of the regulator's ability to regulate at its lower limit; the battery voltage with the vehicle in the NLCI condition should be within a particular range. Once the user has adjusted the vehicle to be in this condition, the user presses the star key 18, causing the code to branch at 664 to task 668 in which the tester 10 measures the battery voltage using voltmeter 100. The battery voltage may be measured once or measured a number of times and then averaged or summed. It is preferably measured a plurality of times and averaged. In either event, a determination is made as to whether the battery voltage (or average or sum) is within an acceptable range while in the NLCI condition. The end points of this range are preferably determined as functions of battery base voltage (battery voltage before the vehicle was started), $V_b$. These endpoints are preferably calculated by adding fixed values to the base voltage $V_b$, e.g., $V_{low}=V_b+0.5$ VDC and $V_{high}=15$ VDC. In the alternative, these endpoints can be determined by performing another mathematical operation with respect to the base voltage $V_b$, e.g., taking fixed percentages of the base voltage $V_b$. The range selected for the embodiment shown in the figures is between $V_b+0.5$ VDC and $V_b=15$ VDC. If the battery voltage (or average or sum) is between those endpoints with the vehicle in the NLCI condition, then the regulator is probably in an acceptable condition with resect to its lower limit of regulation. If the battery voltage (or average or sum) is less than $V_b+0.5$ VDC with the vehicle in the NLCI condition, then the battery voltage (or average or sum) is lower than acceptable and/or expected. If the battery voltage (or average or sum) is greater than $V_b=15$ VDC with the vehicle in the NLCI condition, then the battery voltage (or average or sum) is higher than acceptable and/or expected. The code continues at 670 to task 672, where a NLCI Test Complete Flag is set indicating that the NLCI test has been performed. Then at 674, the code continues to state 676, in which the results of the NLCI test are displayed. Preferably, the following information is displayed to allow the user to make a determination as to whether the regulator is in an acceptable condition: base battery voltage and the battery voltage with the vehicle in the NLCI condition. Also, if the battery voltage with the vehicle in the NLCI condition was below the acceptable/ expected range, a "Low" indication is presented to the user near the test battery voltage. Similarly, if the battery voltage with the vehicle in the NLCI condition was above the acceptable/expected range, a "Hi" indication is presented to the user near the test battery voltage. With this information, the user can make a determination as to whether the regulator is in an acceptable condition with respect to its lower regulation limit. While in state 676, if the user presses the star key 18, the code branches at 678 to state 690.

The No Load/Fast Idle charger test begins at state 690, in which the user is prompted to adjust the vehicle so that the starting/charging system is in a No Load/Fast Idle (NLFI) condition, e.g., very few if any user-selectable loads are turned on and pressure is being applied to the accelerator pedal to cause the vehicle motor to operate at about 2000 revolutions per minute (RPM). The battery voltage of the vehicle while in the NLFI condition provides information about the condition of the regulator's ability to regulate at its upper limit; the battery voltage with the vehicle in the NLFI condition should be within a particular range. Once the user has adjusted the vehicle to be in this condition, the user presses the star key 18, causing the code to branch, at 692, to task 694 in which the tester 10 measures the battery voltage using voltmeter 100. The battery voltage may be measured once or measured a number of times and then averaged or summed. Preferably it is measured a number of times and then averaged. In either event, a determination is made as to whether the battery voltage (or average or sum) is within an acceptable range while in the NLFI condition. The end points of this range are preferably determined as functions of battery base voltage (battery voltage before the vehicle was started), $V_b$. These endpoints are preferably calculated by adding fixed values to the base voltage $V_b$, e.g., $V_{low}=V_b+0.5$ VDC and $V_{high}=15$ VDC. In the alternative, these endpoints can be determined by performing another mathematical operation with respect to the base voltage $V_b$, e.g., taking fixed percentages of the base voltage $V_b$. The range selected for the embodiment shown in the figures is between $V_b+0.5$ VDC and $V_b=15$ VDC. If the battery voltage (or average or sum) is between those endpoints with the vehicle in the NLFI condition, then the regulator is probably in an acceptable condition with respect to its upper limit of regulation. If the battery voltage (or average or sum) is less than $V_b+0.5$ VDC with the vehicle in the NLFI condition, then the battery voltage (or average or sum) is lower than acceptable and/or expected. If the battery voltage (or average or sum) is greater than $V_b=15$ VDC with the vehicle in the NLFI condition, then the battery voltage (or average or sum) is higher than acceptable and/or expected. The code continues at 696 to task 698, where a NLFI Test Complete Flag is set indicating that the NLFI test has been performed. Then at 700, the code continues to state 702, in which the results of the NLFI test are displayed. Preferably, the following information is displayed to allow the user to make a determination as to whether the regulator is in an acceptable condition: base battery voltage (battery voltage before the vehicle was started) and the battery voltage with the vehicle in the NLFI condition. Also, if the battery voltage with the vehicle in the NLFI condition was below the acceptable/expected range, a "Low" indication is presented to the user near the test battery voltage. Similarly, if the battery voltage with the vehicle in the NLFI condition was above the acceptable/expected range, a "Hi" indication is presented to the user near the test battery voltage. With this information, the user can make a determination as to whether the regulator is in an acceptable condition with respect to its upper regulation limit. While in state 702, if the user presses the star key 18, the code branches at 704 to state 720.

The Full Load/Fast Idle charger test begins at state 720, in which the user is prompted to adjust the vehicle so that the starting/charging system is in a Full Load/Fast Idle (FLFI) condition, e.g., most if not all user-selectable loads (lights, blower(s), radio, defroster, wipers, seat heaters, etc.) are turned on and pressure is being applied to the accelerator pedal to cause the vehicle motor to operate at about 2000 RPM. The battery voltage of the vehicle while in the FLFI condition provides information about the condition of the alternator with respect to its power capacity; the battery voltage with the vehicle in the FLFI condition should be within a particular range. Once the user has adjusted the vehicle to be in this condition, the user presses the star key 18, causing the code to branch, at 722, to task 724 in which the tester 10 measures the battery voltage using voltmeter 100. The battery voltage may be measured once or measured a number of times and then averaged or summed. Preferably it is measured a number of times and then averaged. In either event, a determination is made as to whether the battery voltage (or average or sum) is within an acceptable range while in the FLFI condition. The end points of this range are preferably determined as functions of battery base voltage (battery voltage before the vehicle was started), $V_b$. These endpoints are preferably calculated by adding fixed values to the base voltage $V_b$, e.g., $V_{low}=V_b+0.5$ VDC and $V_{high}=15$ VDC. In the alternative, these endpoints can be determined by performing another mathematical operation with respect to the base voltage $V_b$, e.g., taking fixed percentages of the base voltage $V_b$. The range selected for the embodiment shown in the figures is between $V_b+0.5$ VDC and $V_b15$ VDC. If the battery voltage (or average or sum) is between those endpoints with the vehicle in the FLFI condition, then the alternator is probably in an acceptable condition with respect to its power capacity. If the battery voltage (or average or sum) is less than $V_b+0.5$ VDC with the vehicle in the FLFI condition, then the battery voltage (or average or sum) is lower than acceptable and/or expected. If the battery voltage (or average or sum) is greater than $V_b=15$ VDC with the vehicle in the FLFI condition, then the battery voltage (or average or sum) is higher than acceptable and/or expected. The code continues at 726 to task 728, where a FLFI Test Complete Flag is set indicating that the FLFI test has been performed. Then at 730, the code continues to state 732, in which the results of the FLFI test arc displayed. Preferably, the following information is displayed to allow the user to make a determination as to whether the alternator is in an acceptable condition: base battery voltage (battery voltage before the vehicle was started) and the battery voltage with the vehicle in the FLFI condition. Also, if the battery voltage with the vehicle in the FLFI condition was below the acceptable/expected range, a "Low" indication is presented to the user near the test battery voltage. Similarly, if the battery voltage with the vehicle in the FLFI condition was above the acceptable/expected range, a "Hi" indication is presented to the user near the test battery voltage. With this information, the user can make a determination as to whether the alternator is in an acceptable condition with respect to its power capacity. While in state 732, if the user presses the star key 18, the code branches at 734 to state 750.

The alternator diode ripple test begins at state 750, in which the user is prompted to adjust the vehicle so that the starting/charging system is in a Medium Load/Low Idle (MLLI) condition, e.g., the lights are on, but all other user-selectable loads (blower(s), radio, defroster, wipers, seat heaters, etc.) are turned off and pressure is being applied to the accelerator pedal to cause the vehicle motor to operate at about 1000 RPM. For the diode ripple test, the diode ripple circuit 102 is used and the processor measures the diode ripple voltage at 114 at the output of the peak detect circuit 112. The diode ripple voltage with the vehicle while in the MLLI condition provides information about the condition of the diodes in the alternator with a known load (most vehicle lights draw about 65 Watts of power per lamp). The diode ripple voltage 114 with the vehicle in the MLLI condition should be less than a predetermined threshold, e.g., for the circuit of FIG. 4B less than 1.2 VDC for a 12-volt system and less than 2.4 VDC for a 24-volt system. Once the user has adjusted the vehicle to be in this condition, the user presses the star key 18, causing the code to branch, at 752, to task 754 in which the tester 10 measures the ripple voltage using ripple circuit 102. The ripple voltage 114 may be measured once or measured a number of times and then averaged or summed. Preferably it is measured a number of times and then averaged. In either event, a determination is made as to whether the ripple voltage 114 (or average or sum) is less than the acceptable threshold while in the MLLI condition. The threshold ripple voltage selected for the embodiment shown in FIG. 4B is 1.2 VDC for a 12-volt system and 2.4 VDC for a 24-volt system. If the ripple voltage 114 is lower than that threshold with the vehicle in the MLLI condition, then the alternator diodes are probably in an acceptable condition. The code continues at 756 to task 758, where a Diode Ripple Test Complete Flag is set indicating that the diode ripple test has been performed. Then at 760, the code continues to state 762, in which the results of the diode ripple test are displayed. Preferably, either a ripple voltage "OK" or ripple voltage "Hi" message is displayed, depending on the measured ripple voltage relative to the threshold ripple voltage. With this information, the user can make a determination as to whether the alternator diodes are in an acceptable condition. While in state 762, if the user presses the star key 18, the code branches at 764 to state 770.

State 770 an extra state in that it is not a separate test of the starting/charging system 11. As shown in FIG. 10 and discussed in the accompanying text, the user may use the up key 19 (up button) and the down key 20 (down button) to review the results of past tests, to redo previously performed tests and/or skip (keep the data for) previously performed tests. One implementation of this feature of the user interface is shown in more detail in FIGS. 11A–11D. State 770 provides the user with a state between the results of the last test and exiting the test portion of the code so that the user can use the up key 19 and down key 20 to review previous test results and skip and/or redo some of the tests. Pressing the star key 18 while in state 770 causes the code to end, i.e., return, at 772.

Figure 13:
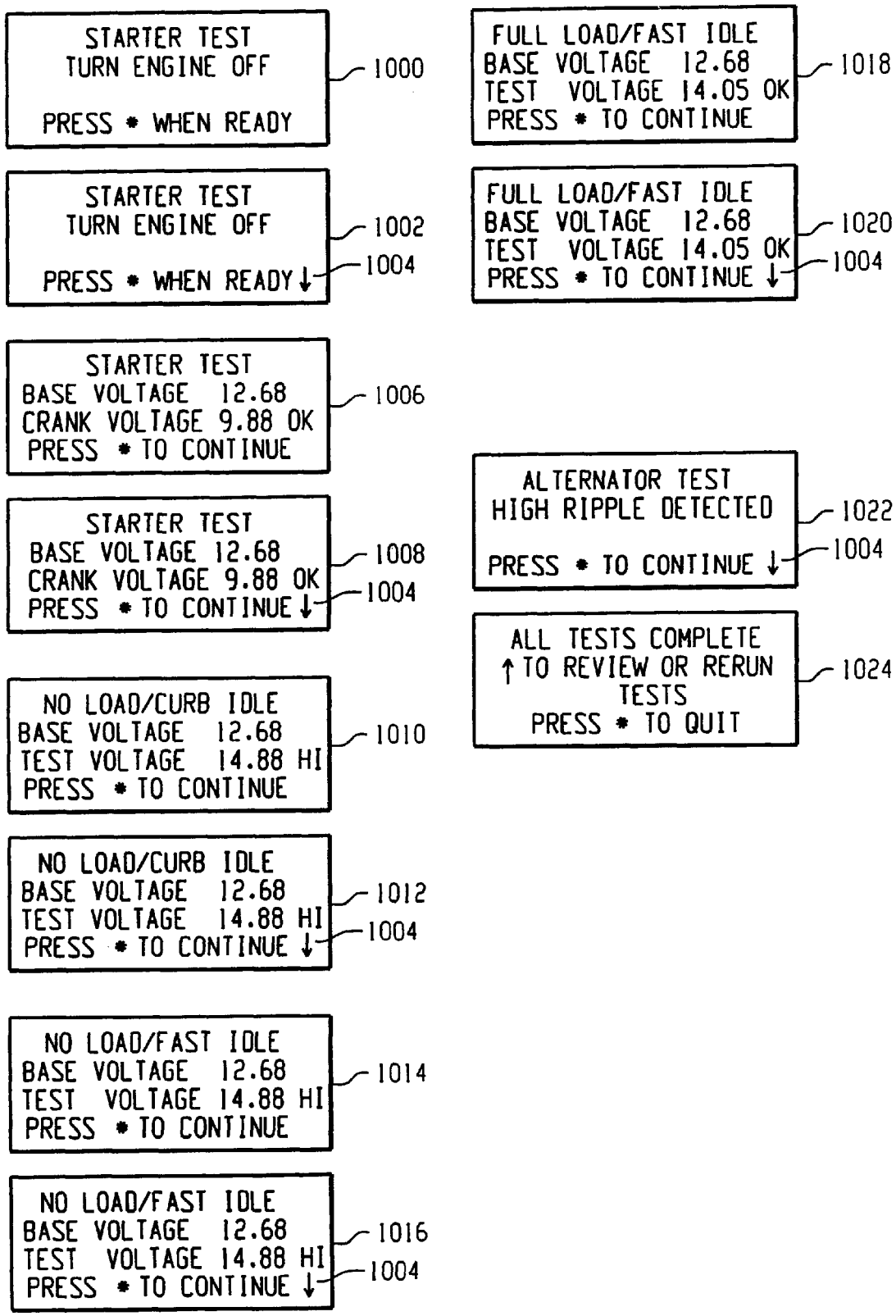
FIG. 13 shows a plurality of representations of screen displays exemplifying an embodiment of user interface according to the present invention.

While in state 602, in which the user is prompted to turn the engine off, pressing the up key 19 does nothing (?please confirm). While in state 602, if the Starter Test has already been performed, i.e., if the Starter Test Complete Flag is set, e.g., at task 672, the display conveys to the user that the down key 20 is active, e.g., by displaying an image corresponding to that key, such as an image of a downwardly pointing arrow. FIG. 13 shows a number of screens for display 26 showing this feature of the user interface. Screen 1000 of FIG. 13 shows a display of a Starter Test prompt, before the Starter Test has been performed, i.e., with the Starter Test Complete Flag cleared. Screen 1002 of FIG. 13 shows a display of the same Starter Test prompt, with the Starter Test Complete Flag set, i.e., after the Starter Test has been performed at least once since the tester 10 was last powered up. Note the presence of down arrow 1004 in screen 1002 that is not in screen 1000, indicating that the down arrow key is active and may be used to skip the Starter Test.

Thus, while in state 602, pressing the down key 20 causes the code to branch to a decision at 780 as to whether the Starter Test has already been performed, i.e., whether the Starter Test Complete Flag is set. If the down key 20 is pressed while the Starter Test Complete Flag is not set, the code remains in state 602 and waits for the user to press the star key 18, which will cause the Starter Test to be redone, starting with branch 604. If the down key 20 is pressed while the Starter Test Complete Flag is set, the code branches at 782 to state 624, discussed above, in which the results of the Starter Test are displayed. Thus, from state 602, if the Starter Test has already been performed, the user may redo that test by pressing the star key 18, or may skip the test (thereby retaining the data and results from the previous execution of that test) by pressing the down key 20.

While in state 606, in which the user is prompted to start the engine, pressing the up key 19 causes the code to branch at 784 back to state 602, discussed above. While in state 606, if the Starter Test has already been performed, i.e., if the Starter Test Complete Flag is set, e.g., at task 622, the display conveys to the user that the down key 20 is active, e.g., by displaying an image corresponding to that key, such as an image of a downwardly pointing arrow (e.g., down arrow 1004 in the screen shots in FIG. 13). While in state 606, pressing the down key 20 causes the code to branch to a decision at 786 as to whether the Starter Test has already been performed, i.e., whether the Starter Test Complete Flag is set. If the down key 20 is pressed while the Starter Test Complete Flag is not set, the code remains in state 606 and waits for the comparator 82b (FIGS. 2 and 4A) to detect a crank and waits for the user to press the star key 18, which will exit the Starter Test 612 via branch 611. If the down key 20 is pressed while the Starter Test Complete Flag is set, the code branches at 788 to state 624, discussed above, in which the results of the Starter Test are displayed. Thus, from state 606, the user may back up to the previous step by pressing the up key 19 and, if the Starter Test has already been performed, the user may redo that test by pressing the star key 18, or may skip the test (thereby retaining the data and results from the previous execution of that test) by pressing the down key 20.

While in state 624, in which the results of the Starter Test are presented to the user, pressing the up key 19 causes the code to branch at 790 to a decision at 792 as to whether the user was prompted to enter a battery temperature during the Starter Test, i.e., whether the battery voltage measured during cranking is between 8.5 VDC and 9.6 VDC and therefore battery temperature is relevant to the cranking voltage determination. If so, the code branches at 794 to state 634, discussed above, in which the user is prompted to enter data with respect to battery temperature. If not, the code branches at 796 to state 606, discussed above, in which the user is prompted to start the engine. While in state 624, if the NLCI Test has already been performed, i.e., if the NLCI Test Complete Flag is set, e.g., at task 672, the display conveys to the user that the down key 20 is active, e.g., by displaying an image corresponding to that key, such as an image of a downwardly pointing arrow. Screen 1006 of FIG. 13 shows a display of the results of a hypothetical Starter Test before the NLCI Test has been performed, i.e., with the NLCI Test Complete Flag cleared. Screen 1008 of FIG. 13 shows a display of the same Starter Test results, with the NLCI Test Complete Flag set, i.e., after the NLCI Test has been performed at least once since the tester 10 was last powered up. Note the presence of down arrow 1004 in screen 1008 that is not in screen 1006, indicating that the down arrow key is active and may be used to skip to the results of the NLCI Test.

Thus, while in state 624, pressing the down key 20 causes the code to branch to a decision at 800 as to whether the NLCI Test has already been performed, i.e., whether the NLCI Test Complete Flag is set. If the down key 20 is pressed while the NLCI Test Complete Flag is not set, the code remains in state 624 and waits for the user to press the star key 18, which will cause the code to branch to the beginning of the NLCI Test, via branch 660. If the down key 20 is pressed while the NLCI Test Complete Flag is set, the code branches at 802 to state 676, discussed above, in which the results of the NLCI Test are displayed. Thus, from state 624, the user may back up to the previous step(s) by pressing the up key 19 and, if the NLCI Test has already been performed, the user may redo that test by pressing the star key 18, or may skip the test (thereby retaining the data and results from the previous execution of that test) by pressing the down key 20.

While in state 662, which is the start of the NLCI Test, pressing the up key 19 causes the code to branch at 804 to state 624, discussed above, in which the results of the Starter Test are presented. While in state 662, if the NLCI Test has already been performed, i.e., if the NLCI Test Complete Flag is set, e.g., at task 672, the display conveys to the user that the down key 20 is active, e.g., by displaying an image corresponding to that key, such as an image of a downwardly pointing arrow (e.g., down arrow 1004 in the screen shots in FIG. 13). While in state 662, pressing the down key 20 causes the code to branch to a decision at 806 as to whether the NLCI Test has already been performed, i.e., whether the NLCI Test Complete Flag is set. If the down key 20 is pressed while the NLCI Test Complete Flag is not set, the code remains in state 662 and waits for the user to press the star key 18, which will cause the code to take a measurement of battery voltage, via branch 664. If the down key 20 is pressed while the NLCI Test Complete Flag is set, the code branches at 808 to state 676, discussed above, in which the results of the NLCI Test are displayed. Thus, from state 662, the user may back up to the previous test step (the end of the Starter Test) by pressing the up key 19 and, if the NLCI Test has already been performed, the user may redo that test by pressing the star key 18, or may skip the test (thereby retaining the data and results from the previous execution of that test) by pressing the down key 20.

While in state 676, in which the results of the NLCI Test are presented to the user, pressing the up key 19 causes the code to branch at 810 to state 662, discussed above, in which the user is prompted to adjust the vehicle into the NLCI condition. While in state 676, if the NLFI Test has already been performed, i.e., if the NLFI Test Complete Flag is set, e.g., at task 698, the display conveys to the user that the down key 20 is active, e.g., by displaying an image corresponding to that key, such as an image of a downwardly pointing arrow. Screen 1010 of FIG. 13 shows a display of the results of a hypothetical NLCI Test before the NLFI Test has been performed, i.e., with the NLFI Test Complete Flag cleared. Screen 1012 of FIG. 13 shows a display of the same NLCI Test results, with the NLFI Test Complete Flag set, i.e., after the NLFI Test has been performed at least once since the tester 10 was last powered up. Note the presence of down arrow 1004 in screen 1012 that is not in screen 1010, indicating that the down arrow key is active and may be used to skip to the results of the NLFI Test.

Thus, while in state 676, pressing the down key 20 causes the code to branch to a decision at 812 as to whether the NLFI Test has already been performed, i.e., whether the NLFI Test Complete Flag is set. If the down key 20 is pressed while the NLFI Test Complete Flag is not set, the code remains in state 676 and waits for the user to press the star key 18, which will cause the code to branch to the beginning of the NLFI Test, via branch 678. If the down key 20 is pressed while the NLFI Test Complete Flag is set, the code branches at 814 to state 702, discussed above, in which the results of the NLFI Test are displayed. Thus, from state 676, the user may back up to the previous step (state 662) by pressing the up key 19 and, if the NLFI Test has already been performed, the user may redo that test by pressing the star key 18, or may skip the test (thereby retaining the data and results from the previous execution of that test) by pressing the down key 20.

While in state 690, which is the start of the NLFI Test, pressing the up key 19 causes the code to branch at 816 to state 676, discussed above, in which the results of the NLCI Test are presented. While in state 690, if the NLFI Test has already been performed, i.e., if the NLFI Test Complete Flag is set, e.g., at task 698, the display conveys to the user that the down key 20 is active, e.g., by displaying an image corresponding to that key, such as an image of a downwardly pointing arrow (e.g., down arrow 1004 in the screen shots in FIG. 13). While in state 690, pressing the down key 20 causes the code to branch to a decision at 820 as to whether the NLFI Test has already been performed, i.e., whether the NLFI Test Complete Flag is set. If the down key 20 is pressed while the NLFI Test Complete Flag is not set, the code remains in state 690 and waits for the user to press the star key 18, which will cause the code to take a measurement of battery voltage, via branch 692. If the down key 20 is pressed while the NLFI Test Complete Flag is set, the code branches at 822 to state 702, discussed above, in which the results of the NLFI Test are displayed. Thus, from state 690, the user may back up to the previous test step (the end of the NLCI Test) by pressing the up key 19 and, if the NLFI Test has already been performed, the user may redo that test by pressing the star key 18, or may skip the test (thereby retaining the data and results from the previous execution of that test) by pressing the down key 20.

While in state 702, in which the results of the NLFI Test are presented to the user, pressing the up key 19 causes the code to branch at 824 to state 690, discussed above, in which the user is prompted to adjust the vehicle into the NLFI condition. While in state 702, if the NLFI Test has already been performed, i.e., if the FLFI Test Complete Flag is set, e.g., at task 728, the display conveys to the user that the down key 20 is active, e.g., by displaying an image corresponding to that key, such as an image of a downwardly pointing arrow. Screen 1014 of FIG. 13 shows a display of the results of a hypothetical NLFI Test before the FLFI Test has been performed, i.e., with the FLFI Test Complete Flag cleared. Screen 1016 of FIG. 13 shows a display of the same NLFI Test results, with the FLFI Test Complete Flag set, i.e., after the FLFI Test has been performed at least once since the tester 10 was last powered up. Note the presence of down arrow 1004 in screen 1016 that is not in screen 1014, indicating that the down arrow key is active and may be used to skip to the results of the FLFI Test.

Thus, while in state 702, pressing the down key 20 causes the code to branch to a decision at 830 as to whether the FLFI Test has already been performed, i.e., whether the FLFI Test Complete Flag is set. If the down key 20 is pressed while the FLFI Test Complete Flag is not set, the code remains in state 702 and waits for the user to press the star key 18, which will cause the code to branch to the beginning of the FLFI Test, via branch 704. If the down key 20 is pressed while the FLFI Test Complete Flag is set, the code branches at 832 to state 732, discussed above, in which the results of the FLFI Test are displayed. Thus, from state 702, the user may back up to the previous step (state 690) by pressing the up key 19 and, if the FLFI Test has already been performed, the user may redo that test by pressing the star key 18, or may skip the test (thereby retaining the data and results from the previous execution of that test) by pressing the down key 20.

While in state 720, which is the start of the FLFI Test, pressing the up key 19 causes the code to branch at 834 to state 702, discussed above, in which the results of the NLFI Test are presented. While in state 720, if the FLFI Test has already been performed, i.e., if the FLFI Test Complete Flag is set, e.g., at task 728, the display conveys to the user that the down key 20 is active, e.g., by displaying an image corresponding to that key, such as an image of a downwardly pointing arrow (e.g., down arrow 1004 in the screen shots in FIG. 13). While in state 720, pressing the down key 20 causes the code to branch to a decision at 840 as to whether the FLFI Test has already been performed, i.e., whether the FLFI Test Complete Flag is set. If the down key 20 is pressed while the FLFI Test Complete Flag is not set, the code remains in state 720 and waits for the user to press the star key 18, which will cause the code to take a measurement of battery voltage, via branch 722. If the down key 20 is pressed while the FLFI Test Complete Flag is set, the code branches at 842 to state 732, discussed above, in which the results of the FLFI Test are displayed. Thus, from state 720, the user may back up to the previous test step (the end of the NLFI Test) by pressing the up key 19 and, if the FLFI Test has already been performed, the user may redo that test by pressing the star key 18, or may skip the test (thereby retaining the data and results from the previous execution of that test) by pressing the down key 20.

While in state 732, in which the results of the FLFI Test are presented to the user, pressing the up key 19 causes the code to branch at 844 to state 720, discussed above, in which the user is prompted to adjust the vehicle into the FLFI condition. While in state 732, if the Diode Ripple Test has already been performed, i.e., if the Diode Ripple Test Complete Flag is set, e.g., at task 758, the display conveys to the user that the down key 20 is active, e.g., by displaying an image corresponding to that key, such as an image of a downwardly pointing arrow. Screen 1018 of FIG. 13 shows a display of the results of a hypothetical FLFI Test before the Diode Ripple Test has been performed, i.e., with the Diode Ripple Test Complete Flag cleared. Screen 1020 of FIG. 13 shows a display of the same FLFI Test results, with the Diode Ripple Test Complete Flag set, i.e., after the Diode Ripple Test has been performed at least once since the tester 10 was last powered up. Note the presence of down arrow 1004 in screen 1020 that is not in screen 1018, indicating that the down arrow key is active and may be used to skip to the results of the Diode Ripple Test.

Thus, while in state 732, pressing the down key 20 causes the code to branch to a decision at 850 as to whether the Diode Ripple Test has already been performed, i.e., whether the Diode Ripple Test Complete Flag is set. If the down key 20 is pressed while the Diode Ripple Test Complete Flag is not set, the code remains in state 732 and waits for the user to press the star key 18, which will cause the code to branch to the beginning of the Diode Ripple Test, via branch 734. If the down key 20 is pressed while the Diode Ripple Test Complete Flag is set, the code branches at 852 to state 762, discussed above, in which the results of the Diode Ripple Test are displayed. Thus, from state 732, the user may back up to the previous step (state 720) by pressing the up key 19 and, if the Diode Ripple Test has already been performed, the user may redo that test by pressing the star key 18, or may skip the test (thereby retaining the data and results from the previous execution of that test) by pressing the down key 20.

While in state 750, which is the start of the Diode Ripple Test, pressing the up key 19 causes the code to branch at 854 to state 732, discussed above, in which the results of the FLFI Test are presented. While in state 750, if the Diode Ripple Test has already been performed, i.e., if the Diode Ripple Test Complete Flag is set, e.g., at task 758, the display conveys to the user that the down key 20 is active, e.g., by displaying an image corresponding to that key, such as an image of a downwardly pointing arrow (e.g., down arrow 1004 in the screen shots in FIG. 13). While in state 750, pressing the down key 20 causes the code to branch to a decision at 860 as to whether the Diode Ripple Test has already been performed, i.e., whether the Diode Ripple Test Complete Flag is set. If the down key 20 is pressed while the Diode Ripple Test Complete Flag is not set, the code remains in state 750 and waits for the user to press the star key 18, which will cause the code to take a measurement of battery voltage, via branch 752. If the down key 20 is pressed while the Diode Ripple Test Complete Flag is set, the code branches at 862 to state 762, discussed above, in which the results of the Diode Ripple Test are displayed. Thus, from state 750, the user may back up to the previous test step (the end of the FLFI Test) by pressing the up key 19 and, if the Diode Ripple Test has already been performed, the user may redo that test by pressing the star key 18, or may skip the test (thereby retaining the data and results from the previous execution of that test) by pressing the down key 20.

While in state 762, in which the results of the Diode Ripple Test are presented to the user, pressing the up key 19 causes the code to branch at 864 to state 750, discussed above, in which the user is prompted to adjust the vehicle into the Diode Ripple condition. While in state 762, the display conveys to the user that the down key 20 is active, e.g., by displaying an image corresponding to that key, such as an image of a downwardly pointing arrow. Screen 1022 of FIG. 13 shows a display of the results of a hypothetical Diode Ripple Test. Note the presence of down arrow 1004 in screen 1022, indicating that the down arrow key is active and may be used to skip to the last state 770. Thus, while in state 762, pressing the down key 20 causes the code to branch via branch 866 to state 770. Thus, from state 762, the user may back up to the previous step (state 750) by pressing the up key 19 and advance to the next step (state 770) by either pressing the star key 18 or by pressing the down key 20.

While in state 770, which is All Tests Complete state, pressing the up key 19 causes the code to branch at 868 back to state 762, discussed above, in which the results of the Diode Ripple Test are presented. This screen is shown as screen 1024 in FIG. 13.

Therefore, while in state 770, after all of the tests have been performed, it takes twelve (12) presses of the up key 19 to move from state 770 back up to the beginning at state 602 (state 770 back to state 762 back to state 750 back to state 732 back to state 720 back to state 702 back to state 690 back to state 676 back to state 662 back to state 624 back to either state 634 or state 606 back to state 602) and takes seven (7) presses of the down key 20 to move back down from state 602 to state 770 (state 602 down to state 624 down to state 676 down to state 702 down to state 732 down to state 762 down to state 770). This user interface of the present invention greatly facilitates the user reviewing results of and redoing, if necessary, previously performed tests with the tester 10. In the alternative, the tester 10 can be coded so that while in state 770, after all of the tests have been performed, it takes twelve (12) presses of the up key 19 to move from state 770 back up to the beginning at state 602, and takes twelve (12) presses of the down key 20 to move from state 602 back down to state 770.

The Starter Test was previously discussed in the context of task 522 in FIG. 10 and tasks 602–624 in FIGS. 11A–11B. Referring now to FIG. 12, additional information about the Starter Test is provided, focusing more on the preferred testing method and less on the user interface than the previous discussions. The Starter Test begins at task 900 in FIG. 12. The Starter Test routine first prompts the user at 902 to turn the engine off and to press the star key 18 when that has been done. The user pressing the star key 18 causes the code to branch at 904 to the next task 906, in which the base battery voltage $V_b$ is measured using the voltmeter circuit 100. Additionally, a crank threshold voltage $V_{ref}$ is calculated by subtracting a fixed value from the base voltage $V_b$, e.g., $V_{ref}=V_b-0.5$ VDC. In the alternative, the crank threshold voltage $V_{ref}$ can be determined by performing another mathematical operation with respect to the base voltage $V_b$, e.g., taking a fixed percentage of the base voltage $V_b$. In any event, a value corresponding to the threshold voltage $V_{ref}$ is transferred from the processor 42 to the DAC 80 via bus 81 to cause the DAC 80 to output the threshold voltage $V_{ref}$ at output 83b as one input to comparator 82b. In this state, after the voltage at output 83b stabilizes, the comparator 82b constantly monitors the battery voltage, waiting for the battery voltage to drop to less than (or less than or equal to) the threshold level $V_{ref}$.

Next, at step 908, the user is prompted to either start the engine of the vehicle under test or press the star key 18 to abort the starter test. Next, via branch 910, the code enters a loop in which the processor 42 periodically polls the input corresponding to comparator 82b to determine if the battery voltage has dropped to less than (or less than or equal to) the threshold level $V_{ref}$ and periodically polls the inputs corresponding to switches 18–21 to determine if any key has been pressed. Thus, at decision 912, if the output 85b of comparator 82b remains in a HIGH state, the processor tests at 914 whether any key has been pressed. If not, the processor 42 again tests the comparator to determine whether the comparator has detected a battery voltage drop, and so on. If at test 914 a key press has been detected, the message "Crank Not Detected" is displayed at 916 and the routine ends at 918.

On the other hand, at decision 912, if the processor 42 determines that the output 85b of comparator 82b has transitioned from a HIGH state to a LOW state, then the battery voltage has dropped to less than the threshold level $V_{ref}$ and the processor branches via 920 to code at 922 that waits a predetermined period of time, preferably between about 10 milliseconds and about 60 milliseconds, more preferably about 40 milliseconds, and most preferably 40 milliseconds, before beginning to sample the battery voltage, i.e., the cranking voltage. Waiting this period of time permits the starter motor to stabilize so that the measured voltage is a stable cranking voltage and not a transient voltage as the starter motor begins to function. Additionally, the code at 922 also sets a variable N to 1 and preferably displays a message to the user via display 24, e.g., "Testing." The variable N is used to track the number of samples of cranking voltage that have been taken.

Next at 924 the cranking volts $V_c$ are measured using voltmeter 100 and the measured cranking voltage is stored by processor 42 as $V_c(N)$. Then the most recently measured cranking voltage sample $V_c(N)$ is compared to the value corresponding to the threshold voltage $V_{ref}$ that was previously used at step 912 to determine the start of the cranking cycle, at 926. On the one hand, if at 926 the battery voltage is still less than $V_{ref}$, then it is safe to assume that the starter motor is still cranking and the measurement $V_c(N)$ represents a cranking voltage. Accordingly, the processor next at 928 determines if eight (8) samples have been taken. If so, the code branches at 930 to task 932. If not, then N is incremented at 934 and another cranking voltage sample is taken and stored at 924 and the loop iterates.

On the other hand, if at 926 the battery voltage has risen to the extent that it is greater than $V_{ref}$, then it is safe to assume that the car has started and it is meaningless to continue to measure and store battery voltage, because the battery voltage samples no longer represent a cranking voltage. Accordingly, the processor next at 936 tests to determine if only one sample has been collected. If so, then the code branches to task 932. If not, then the processor 42 has taken more than one measurement of battery voltage and one voltage may be discarded by decrementing N at 938 under the assumption that the Nth sample was measured after the car had started (and thus does not represent a cranking voltage), and the code continues to task 932.

At 932, the N collected cranking voltages are averaged to determine an average cranking voltage $V_c^{avg}$. At this stage, the rest of FIG. 12 is essentially like that shown in FIG. 11A, except that a table of threshold values is set forth in FIG. 12. If the average cranking voltage $V_c^{avg}$ is greater than 9.6 VDC, then the cranking voltage is deemed to be "OK" no matter what the temperature is, and the code branches at 946, displays a corresponding message at 948, and ends at 950. On the other hand, if the average cranking voltage $V_c^{avg}$ is less than 8.5 VDC, then the battery voltage during starting ("cranking voltage") is deemed to be "Low" no matter what the temperature is, i.e., there might be problems with the starter, and the code branches at 940, displays a corresponding message at 942, and ends at 944. Finally, if the average cranking voltage is between 8.5 VDC and 9.6 VDC, then the processor 42 needs temperature information to make a determination as to the starter. Accordingly, the processor 42 at step 952 prompts the user with respect to the temperature of the battery with a message via display 24 such as, "Temperature above xx°?" where xx is a threshold temperature corresponding to the average measured cranking voltage from the table 954 in FIG. 12. For example, if the average cranking voltage $V_c^{avg}$ is between 9.1 VDC and 9.3 VDC, the user is preferably prompted to enter whether the battery temperature is above 30° F. Similarly, if the average cranking voltage $V_c^{avg}$ is between 9.3 VDC and 9.4 VDC, the user is preferably prompted to enter whether the battery temperature is above 40° F. In the alternative, the processor 42 can interpolate between the various temperatures in the table in 954. For example, if the average cranking voltage $V_c^{avg}$ is 9.2 VDC, the user can be prompted to enter whether the battery temperature is above 35° F. and if the average cranking voltage $V_c^{avg}$ is 9.35 VDC, the user can be prompted to enter whether the battery temperature is above 45° F. On the one hand, if the user indicates that the battery temperature is greater than the threshold temperature, then the code branches at 956, displays a corresponding message at 942, and ends at 944. On the other hand, if the user indicates that the battery temperature is less than the threshold temperature, then the code branches at 958, displays a corresponding message at 948, and ends at 950.

While the present invention has been illustrated by the description of embodiments thereof, and while the embodiments have been described in some detail, it is not the intention of the applicant to restrict or in any way limit the scope of the appended claims to such detail. Additional advantages and modifications will readily appear to those skilled in the art. For example, the housing connector J1 can be replaced with a number of discrete connections, e.g., a number of so-called "banana plug" receptors, preferably with at least one of the discrete connections providing a signal to the detection circuitry. Therefore, the invention in its broader aspects is not limited to the specific details, representative apparatus and methods, and illustrative examples shown and described. Accordingly, departures may be made from such details without departing from the spirit or scope of the applicant's general inventive concept.

What is claimed is:

1. A hand-held, portable tester for testing a starter/charger system of an internal combustion engine, comprising:
   (a) an electronic test circuit, said test circuit capable of performing at least one test on the starting/charging system;
   (b) a hand-held, portable enclosure housing said electronic test circuit;
   (c) a housing connector providing a first plurality of electrical connections, said housing connector being affixed to said housing and in circuit communication with said electronic test circuit, for placing said electronic test circuit in circuit communication with the starter/charger system via a test cable electrically connected to said housing connector via a removable cable connector providing a second plurality of electrical connections; and
   (d) detection circuitry, said detection circuitry being in circuit communication with said electronic test circuit and at least one connection of said first plurality of connections of said housing connector, said housing connector accepting a plurality of different types of test cables, and wherein said detection circuitry is characterized by automatic identification of the type of test cable connected to said housing connector as being one of the plurality of types of test cables.

2. A hand-held, portable tester for testing a starter/charger system of an internal combustion engine according to claim 1, wherein said detection circuitry is further characterized by automatic identification of the type of test cable connected to said housing connector as being one of the plurality of types of test cables by detection of an electrical characteristic of the test cable connected to said housing connector at one or more of the plurality of electrical connections provided by said housing connector.

3. A hand-held, portable tester for testing a starter/charger system of an internal combustion engine according to claim 1, wherein said detection circuitry is further characterized by automatic identification of the type of test cable connected to said housing connector as being one of the plurality of types of test cables by detection of two or more of the first plurality of electrical connections provided by said housing connector being essentially shorted together by corresponding electrical connections provided by said cable connector.

4. A hand-held, portable tester for testing a starter/charger system of an internal combustion engine according to claim 1, wherein said detection circuitry is further characterized by automatic identification of the type of test cable connected to said housing connector as being one of the plurality of types of test cables by detection of at least one electrical resistance placed in circuit communication between two or more of the first plurality of electrical connections provided by said test cable.

5. A hand-held, portable tester for testing a starter/charger system of an internal combustion engine according to claim 1, wherein said detection circuitry is characterized by automatic alternative identification of a shorter test cable connected to said housing connector and an alternative longer test cable connected to said housing connector, and wherein said test circuit adjusts at least one parameter of said test circuit, responsive to said detection circuit detecting said longer test cable, to compensate for the additional length of said longer test cable relative to said shorter test cable.

6. A hand-held, portable tester for testing a starter/charger system of an internal combustion engine according to claim 5, wherein said test circuit further comprises a processor in circuit communication with said detection circuitry, said processor performing at least one calculation on at least one value while performing the a; least one test on the starting/charging system, and wherein said test circuit adjusting at least one parameter of said test circuit comprises said processor adjusting the at least one value to compensate for the additional length of said longer test cable relative to said shorter test cable.

7. A hand-held, portable tester for testing a starter/charger system of an internal combustion engine according to claim 6, wherein said electronic test circuit is further characterized by performing at least one test on a starting unit of the starting/charging system, at least one test on a battery of the starting/charging system, and at least four tests on a charging unit of the starting/charging system, at least one of said tests on the charging unit of the starting/charging system being a diode ripple test.

8. A hand-held, portable tester for testing a starter/charger system of an internal combustion engine according to claim 5, wherein said longer test cable comprises an extender cable in circuit communication between a test cable and said housing connector, and wherein said test circuit adjusts at least one parameter of said test circuit, responsive to said detection circuit detecting said extender cable, to compensate for the additional length of said longer test cable relative to said shorter test cable.

9. A hand-held, portable tester for testing a starter/charger system of an internal combustion engine according to claim 8, wherein said test circuit further comprises a processor in circuit communication with said detection circuitry, said processor performing at least one calculation on at least one value while performing the at least one test on the starting/charging system, and wherein said test circuit adjusting at least one parameter of said test circuit comprises said processor adjusting the at least one value to compensate for the additional length of said longer test cable relative to said shorter test cable.

10. A hand-held, portable tester for testing a starter/charger system of an internal combustion engine according to claim 5, wherein said longer test cable comprises an extender cable in circuit communication between said shorter test cable and said housing connector, and wherein said test circuit adjusts at least one parameter of said test circuit, responsive to said detection circuit detecting said extender cable, to compensate for the additional length of said longer test cable relative to said shorter test cable.

11. A hand-held, portable tester for testing a starter/charger system of an internal combustion engine according to claim 10, wherein said test circuit further comprises a processor in circuit communication with said detection circuitry, said processor performing at least one calculation on at least one value while performing the at least one test on the starting/charging system, and wherein said test circuit adjusting at least one parameter of said test circuit comprises said processor adjusting the at least one value to compensate for the additional length of said longer test cable relative to said shorter test cable.

12. A hand-held, portable tester for testing a starter/charger system of an internal combustion engine according to claim 8, wherein said electronic test circuit is further characterized by performing at least one test on a starting unit of the starting/charging system, at least one test on a battery of the starting/charging system, and at least four tests on a charging unit of the starting/charging system, at least one of said tests on the charging unit of the starting/charging system being a diode ripple test.

13. A hand-held, portable tester for testing a starter/charger system of an internal combustion engine according to claim 5, wherein said electronic test circuit is further characterized by performing at least one test on a starting unit of the starting/charging system, at least one test on a battery of the starting/charging system, and at least four tests on a charging unit of the starting/charging system, at least one of said tests on the charging unit of the starting/charging system being a diode ripple test.

14. A hand-held, portable tester for testing a starter/charger system of an internal combustion engine according to claim 1, wherein said detection circuitry is characterized by automatic alternative identification of a shorter test cable connected to said housing connector and an alternative longer test cable connected to said housing connector, and wherein said test circuit adjusts at least one parameter of said test circuit, responsive to said detection circuit detecting said shorter test cable, to compensate for the shorter length of said shorter test cable relative to said longer test cable.

15. A hand-held, portable tester for testing a starter/charger system of an internal combustion engine according to claim 1, wherein said detection circuitry is characterized by automatic alternative identification of a shorter test cable connected to said housing connector and a longer test cable connected to said housing connector, and wherein said test circuit adjusts at least one parameter of said test circuit, responsive o said detection circuit detecting at least one of said longer test cable and said shorter test cable, to compensate for the difference in length between said longer test cable and said shorter test cable.

16. A hand-held, portable tester for testing a starter/charger system of an internal combustion engine according to claim 15, wherein said test circuit further comprises a processor in circuit communication with said detection circuitry, said processor performing at least one calculation on at least one value while performing the at least one test on the starting/charging system, and wherein said test circuit adjusting at least one parameter of said test circuit comprises said processor adjusting the at least one value to compensate for the difference in length between said longer test cable and said shorter test cable.

17. A hand-held, portable tester for testing a starter/charger system of an internal combustion engine according to claim 15, wherein said longer test cable comprises an extender cable in circuit communication between a test cable and said housing connector, and wherein said test circuit adjusts at least one parameter of said test circuit, responsive to said detection circuit detecting at least one of said extender cable and said shorter test cable, to compensate for the difference in length between said longer test cable and said shorter test cable.

18. A hand-held, portable tester for testing a starter/charger system of an internal combustion engine according to claim 17, wherein said test circuit further comprises a processor in circuit communication with said detection circuitry, said processor performing at least one calculation on at least one value while performing the at least one test on the starting/charging system, and wherein said test circuit adjusting at least one parameter of said test circuit comprises said processor adjusting the at least one value to compensate for the difference in length between said longer test cable and said shorter test cable.

19. A hand-held, portable tester for testing a starter/charger system of an internal combustion engine according to claim 15, wherein said longer test cable comprises an extender cable in circuit communication between said shorter test cable and said housing connector, and wherein said test circuit adjusts at least one parameter of said test circuit, responsive to said detection circuit detecting at least one of said extender cable and said shorter test cable, to compensate for the difference in length between said longer test cable and said shorter test cable.

20. A hand-held, portable tester for testing a starter/charger system of an internal combustion engine according to claim 19, wherein said test circuit further comprises a processor in circuit communication with said detection circuitry, said processor performing at least one calculation on at least one value while performing the at least one test on the starting/charging system, and wherein said test circuit adjusting at least one parameter of said test circuit comprises said processor adjusting the at least one value to compensate for the difference in length between said longer test cable and said shorter test cable.

21. A hand-held, portable tester for testing a starter/charger system of an internal combustion engine according to claim 1, wherein said detection circuitry comprises a voltage divider having at least first and second resistances separated by a central node, wherein said first resistance is in circuit communication between the central node and at least one connection of said first plurality of connections of said housing connector, and wherein automatic identification of the type of test cable connected to said housing connector is based at least in part on a voltage present at the central node with the test cable connected to said housing connector.

22. A hand-held, portable tester for testing a starter/charger system of an internal combustion engine according to claim 1, wherein said detection circuitry comprises a voltage divider having at least first and second resistances separated by a central node, wherein said first resistance is in circuit communication between the central node and at least one connection of said first plurality of connections of said housing connector, and wherein said detection circuitry further comprises a third resistance, said third resistance being in circuit communication between the central node and at least one other connection of said first plurality of connections of said housing connector, and wherein automatic identification of the type of test cable connected to said housing connector is based at least in part on a voltage present at the central node with the test cable connected to said housing connector.

23. A hand-held; portable tester for testing a starter/charger system of an internal combustion engine according to claim 1, wherein said electronic test circuit is further characterized by performing at least one test on a starting unit of the starting/charging system, at least one test on a battery of the starting/charging system, and at least four tests on a charging unit of the starting/charging system, at least one of said tests on the charging unit of the starting/charging system being a diode ripple test.

24. A method of testing a starting system of an internal combustion engine, comprising the steps of:

(a) determining a base battery voltage corresponding to a measured voltage of a battery connected to the starting system;

(b) establishing a cranking start threshold voltage from the base battery voltage;

(c) establishing a cranking end threshold voltage from the base battery voltage;

(d) monitoring the battery voltage of the battery connected to the starting system;

(e) responsive to the battery voltage dropping to the cranking start threshold voltage, waiting a predetermined period of time and then determining N successive battery voltages corresponding to N successive voltages of the battery connected to the starting system;

(f) deetermining which M of the N successive battery voltages are to be used to analyze the starting system;

(g) determining a starter test voltage using the M battery voltage values;

(h) if the starter test voltage is greater than a predetermined voltage, displaying a first indication with respect to the starter system;

(i) if the starter test voltage is less than a predetermined voltage, displaying a second indication with respect to the starter system;

(j) if the starter test voltage is between first and second predetermined voltages:
  i. determining, from at least the starter test voltage, a threshold temperature corresponding to a temperature of the battery connected to the starting system;
  ii. prompting a user to input a temperature condition of the battery connected to the starting system;
  iii. reading the temperature condition;
  iv. determining, at least in part from the temperature condition relative to the determined threshold temperature, a condition of the starter system; and
  v. displaying an indication corresponding to the determined condition of the starter system.

25. A method of testing a starting system of an internal combustion engine according to claim 24, wherein M equals N.

26. A method of testing a starting system of an internal combustion engine according to claim 24, wherein M equals one.

27. A method of testing a starting system of an internal combustion engine according to claim 24, wherein said step (g) comprises the step of determining a starter test voltage by taking an average value of the M battery voltage values.

28. A method of testing a starting system of an internal combustion engine according to claim 24, wherein said step (j)(ii) comprises the steps of displaying the determined threshold temperature to the user and prompting the user to input whether the battery connected to the starting system is greater than or less than the determined threshold temperature.

29. A method of testing a starting system of an internal combustion engine according to claim 24, wherein said step (j)(i) comprises the step of determining, from at least the starter test voltage, a threshold temperature range defined by first and second temperatures and corresponding to a temperature range of the battery connected to the starting system, wherein said step (j)(ii) comprises the steps of displaying the determined threshold temperature range to the user and prompting the user to input whether the battery connected to the starting system is between the first and second temperatures defining the determined threshold temperature range, and wherein said step (j)(iv) comprises the step of Determining, at least in part from the temperature condition relative to the determined threshold temperature range, a condition of the starter system.

30. A method of testing a starting system of an internal combustion engine according to claim 24, wherein said step (f) comprises the step of determining which M of the N successive battery voltages are to be used to analyze the starting system based on whether any of the N successive battery voltages are greater than the cranking end threshold voltage.

31. A method of testing a starting system of an internal combustion engine according to claim 24, wherein said step (f) comprises the step of determining which M of the N successive battery voltages are to be used to analyze the starting system by setting M equal to N if none of the N successive battery voltages are greater than the cranking end threshold voltage and by setting M equal to N minus 1 if the Nth of the N successive battery voltages is greater than the cranking end threshold voltage.

32. A user interface method for facilitating the performance and management of multiple, sequentially performed tests on an internal combustion engine system being performed in a portable, hand-held tester, comprising the steps of:

(a) providing a hand-held, portable tester capable of performing multiple, sequentially performed tests of one or more parameters of the internal combustion engine system;

(b) providing a user with a user interface via the tester to permit the user to cause the tester to provide a display corresponding to a previously performed test; and (c) providing a user with a user interface via the tester to permit the user to either, in the alternative, re-perform the previously performed test, or skip the previously performed test thereby retaining the results from the previous performance of the previously performed test.

33. A user interface method for facilitating the performance and management of multiple, sequentially performed tests on an internal combustion engine being performed in a portable, hand-held tester according to claim 32 further comprising the step of, while providing a display corresponding to a previously performed test, providing to the User with an indication that the user may skip the previously performed test thereby retaining the results from the previous performance of the previously performed test.

34. A user interface method for facilitating the performance and management of multiple, sequentially performed tests on an internal combustion engine being performed in a portable, hand-held tester according to claim 32 further comprising the step of while providing a display corresponding to a previously performed test, providing to the user with a visual indication that the user may skip the previously performed test thereby retaining the results from the previous performance of the previously performed test.

35. A user interface method for facilitating the performance and management of multiple, sequentially performed tests on an internal combustion engine being performed in a portable, hand-held tester, according to claim 32 wherein said step (c) comprises the step of providing the user with a user interface with the tester permitting the user to either, in the alternative for each previously performed step, re-perform the previously performed test, or skip the previously performed test thereby retaining the results from the previous performance of the previously performed test.

36. A user interface method for facilitating the performance and management of multiple, sequentially performed tests on an internal combustion engine being performed in a portable, hand-held tester according to claim 35 further comprising the step of, while providing a display corresponding to a previously performed test, providing to the user with an indication that the user may skip the previously performed test thereby retaining the results from the previous performance of the previously performed test.

37. A user interface method for facilitating the performance and management of multiple, sequentially performed tests on an internal combustion engine being performed in a portable, hand-held tester according to claim 35 further comprising the step of, while providing a display corresponding to a previously performed test, providing to the user with a visual indication that the user may skip the previously performed test thereby retaining the results from the previous performance of the previously performed test.

38. A user interface method for facilitating the performance and management of multiple, sequentially performed tests on an internal combustion engine being performed in a portable, hand-held tester according to claim 32 wherein said step (a) comprises the step of providing a hand-held, portable tester capable of performing at least (i) a starter test, (ii) a no load, curb idle charger test, (iii) a no load, fast idle charger test, (iv) a high load, fast idle charger test, and (v) a diode ripple test of the internal combustion engine system.

39. A user interface method for facilitating the performance and management of multiple, sequentially performed tests on an internal combustion engine system being performed in a portable, hand-held tester, comprising the steps of:

(a) providing a hand-held, portable tester capable of performing multiple, sequentially performed tests of one or more parameters of the internal combustion engine system;

(b) entering a first test state in which a user is prompted to place the tester and internal combustion engine system into a first test state;

(c) while in the first test state, automatically collecting at least one datum with respect to the internal combustion engine system;

(d) while in the first test state, displaying a first test result to the user with respect to the at least one datum collected in the first test state;

(e) then entering a next test state in which the user is prompted to place the tester and internal combustion engine system into a next test state;

(f) while in the next test state, automatically collecting at least one datum with respect to the internal combustion engine system;

(g) while in the next test state, displaying a next test result to the user with respect to the at least one datum collected in the next test state;

(h) performing steps (e)–(g) for at least one other sequentially performed test;

(i) providing the user with a first input device;

(j) while in one of the plurality of next test states, responsive to the user actuating the first input device, entering the previous test state, if any, causing the tester to provide a display corresponding to the previously performed test of the previous test state;

(k) providing the user with a second input device;

(l) while in any of the plurality of test states corresponding to a test that has been previously performed, responsive to the user actuating the second input device, skipping the presently displayed test and advancing to the next test state, thereby retaining the results from the previous performance of that particular previously performed test.

40. A user interface method for facilitating the performance and management of multiple, sequentially performed tests on an internal combustion engine being performed in a portable, hand-held tester according to claim 39 further comprising the step of, while providing a display corresponding to a previously performed test, providing to the user with an indication that the user may skip the previously performed test thereby retaining the results from the previous performance of the previously performed test.

41. A user interface method for facilitating the performance and management of multiple, sequentially performed tests on an internal combustion engine being performed in a portable, hand-held tester according to claim 39 further comprising the step of, while providing a display corresponding to a previously performed test, providing to the user with a visual indication that the user may skip the previously performed test thereby retaining the results from the previous performance of the previously performed test.

42. A user interface method for facilitating the performance and management of multiple, sequentially performed tests on an internal combustion engine system being performed in a portable, hand-held tester, comprising the steps of:

(a) providing a hand-held, portable tester capable of performing multiple, sequentially performed tests of one or more parameters of the internal combustion engine system, the tester having a plurality of test states;

(b) providing a user with a user interface via the tester to permit the user to cause the tester to providing a display corresponding to a previous test state; and (c) providing a user with a user interface via the tester to permit the user to either, in the alternative, re-perform actions associated with the previous test state, or skip the previous test state thereby retaining input, if any, inputted while previously in that previous test state.

43. A user interface method for facilitating the performance and management of multiple, sequentially performed tests on an internal combustion engine being performed in a portable, hand-held tester according to claim 42 further comprising the step of, while providing a display corresponding to a previous test state, providing to the user with an indication that the user may skip the previous test state thereby retaining input, if any, inputted while previously in that previous test state.

44. A user interface method for facilitating the performance and management of multiple, sequentially performed tests on an internal combustion engine being performed in a portable, hand-held tester according to claim 42 further comprising the step of, while providing a display corresponding to a previous test state, providing to the user with a visual indication that the user may skip the previous test state thereby retaining input, if any, inputted while previously in that previous test state.

* * * * *

UNITED STATES PATENT AND TRADEMARK OFFICE
CERTIFICATE OF CORRECTION

PATENT NO. : 6,570,385 B1
DATED : May 27, 2003
INVENTOR(S) : Robert A. Roberts, Matthew H. Koran and Hamid Namaky It is certified that error appears in the above-identified patent and that said Letters Patent is hereby corrected as shown below:

Column 28,
Line 16, please delete "a;" and insert -- at --.

Column 29,
Line 39, please delete "o" and insert -- to --.

Column 30,
Line 57, after "hand-held" please delete ";" and insert -- , --.

Column 31,
Line 10, please delete "(c)" and insert -- (e) --.
Line 15, please delete "deetermining" and insert -- determining --.

Column 32,
Line 1, please delete "Determining" and insert -- determining --.
Line 43, please delete "User" and insert -- user --.

Signed and Sealed this

Twenty-second Day of July, 2003

JAMES E. ROGAN
*Director of the United States Patent and Trademark Office*